US012696592B2

(12) United States Patent
Oh et al.

(10) Patent No.: US 12,696,592 B2
(45) Date of Patent: Jul. 28, 2026

(54) LIGHT EMITTING DEVICE

(71) Applicant: SEOUL VIOSYS CO., LTD., Ansan-si (KR)

(72) Inventors: Se Hee Oh, Ansan-si (KR); Jae Kwon Kim, Ansan-si (KR); Jong Kyu Kim, Ansan-si (KR); Hyun A Kim, Ansan-si (KR); Joon Sup Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 699 days.

(21) Appl. No.: 17/987,711

(22) Filed: Nov. 15, 2022

(65) Prior Publication Data

US 2023/0079200 A1 Mar. 16, 2023

Related U.S. Application Data

(63) Continuation of application No. 16/823,734, filed on Mar. 19, 2020, now Pat. No. 11,515,451, which is a
(Continued)

(30) Foreign Application Priority Data

Sep. 28, 2017 (KR) ......................... 10-2017-0126242
Sep. 7, 2018 (KR) ......................... 10-2018-0107215

(51) Int. Cl.
*H10H 20/819* (2025.01)
*H10H 20/814* (2025.01)
(Continued)

(52) U.S. Cl.
CPC ........ *H10H 20/841* (2025.01); *H10H 20/814* (2025.01); *H10H 20/835* (2025.01); *H10H 20/8506* (2025.01); *H10W 72/20* (2026.01)

(58) Field of Classification Search
CPC .................................................... H10H 20/819
(Continued)

(56) References Cited

U.S. PATENT DOCUMENTS 8,476,644 B2 7/2013 Illek et al.
10,892,390 B2 1/2021 Seo et al.
(Continued)

FOREIGN PATENT DOCUMENTS

EP 2605295 6/2013
EP 2605295 A2 6/2013
(Continued)

OTHER PUBLICATIONS

European Search Report for European Application EP 24154569, dated Apr. 16, 2024.
(Continued)

*Primary Examiner* — Hsin Yi Hsieh
(74) *Attorney, Agent, or Firm* — Ashurst Perkins Coie US LLP

(57) ABSTRACT

A light emitting diode chip having improved light extraction efficiency is provided. The light emitting diode chip includes a substrate, a first conductivity type semiconductor layer, a mesa, a side coating layer, and a reflection structure. The first conductivity type semiconductor layer is disposed on the substrate. The mesa includes an active layer and a second conductivity type semiconductor layer. The mesa is disposed on a partial region of the first conductivity type semiconductor layer to expose an upper surface of the first conductivity type semiconductor layer along an edge of the first conductivity type semiconductor layer. The side coating layer(s) covers a side surface of the mesa. The reflection structure is spaced apart from the side coating layer(s) and disposed on the exposed first conductivity type semiconductor layer.

14 Claims, 20 Drawing Sheets

Related U.S. Application Data continuation of application No. PCT/KR2018/010858, filed on Sep. 14, 2018.

(51) Int. Cl.

| | |
|---|---|
| *H10H 20/832* | (2025.01) |
| *H10H 20/841* | (2025.01) |
| *H10H 20/85* | (2025.01) |
| *H10W 72/20* | (2026.01) |

(58) Field of Classification Search

USPC .......................................................... 257/98

See application file for complete search history.

(56) References Cited

U.S. PATENT DOCUMENTS

| | | | |
|---|---|---|---|
| 2005/0281303 A1 | 12/2005 | Horio et al. | |
| 2013/0146920 A1* | 6/2013 | Hong ................... | H10H 20/831 |
| | | | 257/98 |
| 2015/0270442 A1 | 9/2015 | Chae et al. | |
| 2015/0349208 A1 | 12/2015 | Kim et al. | |
| 2015/0380608 A1 | 12/2015 | Lowenthal et al. | |
| 2017/0098739 A1 | 4/2017 | Gaevski et al. | |
| 2017/0141275 A1 | 5/2017 | Kim et al. | |
| 2018/0138368 A1* | 5/2018 | Jang ..................... | H10H 20/814 |
| 2020/0220049 A1 | 7/2020 | Oh et al. | |

FOREIGN PATENT DOCUMENTS

| | | |
|---|---|---|
| EP | 2757598 A2 | 7/2014 |
| EP | 2605295 A3 | 11/2015 |
| KR | 1020130137819 | 12/2013 |
| KR | 1020140081408 | 7/2014 |
| KR | 1020150091922 | 8/2015 |
| KR | 1020150138977 | 12/2015 |
| KR | 20170039490 A | 4/2017 |
| KR | 1020170039490 | 4/2017 |
| KR | 20170052854 A | 5/2017 |
| KR | 1020170052854 | 5/2017 |
| KR | 1020170056105 | 5/2017 |
| KR | 1020170064775 | 6/2017 |
| WO | 2014204271 A1 | 12/2014 |
| WO | 2015008184 | 1/2015 |
| WO | 2015008184 A1 | 1/2015 |
| WO | 2017010705 A1 | 1/2017 |

OTHER PUBLICATIONS

Extended European Search Report issued to corresponding EP Application No. 18860374.0, issued Apr. 30, 2021.

International Search Report for International Application PCT/KR2018/010858, mailed Feb. 8, 2019.

First Examination Report issued to India counterpart application No. 202037006581, mailed May 24, 2021.

Office Action from corresponding related Indian Application No. 202438001333 dated Jan. 6, 2026.

Extended European Search Report from related corresponding European U.S. Appl. No. 25/193,295, dated May 22, 2026.

* cited by examiner

LIGHT EMITTING DEVICE

CROSS-REFERENCE OF RELATED APPLICATIONS

This application is a continuation of U.S. application Ser. No. 16/823,734, filed on Mar. 19, 2020, which is a continuation of International Patent Application No. PCT/KR2018/010858, filed on Sep. 14, 2018, and claims priority from and the benefit of Korean Patent Application No. 10-2017-0126242, filed on Sep. 28, 2017, and Korean Patent Application No. 10-2018-0107215, filed on Sep. 7, 2018, each of which are incorporated by reference for all purposes as if fully set forth herein.

TECHNICAL FIELD

The present disclosure relates to a light emitting diode chip, and more particularly, to a light emitting diode chip having improved light extraction efficiency.

BACKGROUND

A plurality of light emitting diode chips is formed on a single substrate, and then divided along isolation regions to obtain an individual light emitting diode chip. In this case, chips may be divided by irradiating the isolation regions with a laser. For this purpose, except for the substrate and/or a GaN layer, other layers such as an electrode, an insulation layer, and the like are not disposed in the isolation regions.

The layers, other than the substrate and/or the GaN layer, when disposed in the isolation region, may be subject to damage during a dividing process of chips. Damage to each layer generated in the isolation region not only reduces the reliability of the light emitting diode chips, but chip failure may also occur, because such damage is not limited to the isolation region but extends to an internal region. As a result, damage to an edge of the individual light emitting diode chips corresponding to the isolation region may result in reducing yield of the light emitting diode chips.

Meanwhile, when only the substrate and/or the GaN layer is disposed in the isolation region, a decrease in reliability and a decrease in yield of the chips may be prevented. However, light loss due to light leakage occurs in the edge region of the individual light emitting diode chips corresponding to the isolation region, and thus a luminous efficiency of the light emitting diode may be reduced.

SUMMARY

Embodiments of the present disclosure provide a light emitting diode chip capable of improving light extraction efficiency while preventing a decrease in reliability and a decrease in yield.

A light emitting diode chip according to one embodiment of the present disclosure includes; a substrate; a first conductivity type semiconductor layer disposed on the substrate; a mesa including an active layer and a second conductivity type semiconductor layer. The mesa is disposed on a partial region of the first conductivity type semiconductor layer to expose an upper surface of the first conductivity type semiconductor layer along an edge of the first conductivity type semiconductor layer. The light emitting diode chip further includes a side coating layer(s) covering a side surface of the mesa, and a reflection structure spaced apart from the side coating layer(s) and disposed on the exposed first conductivity type semiconductor layer A light emitting diode chip according to another embodiment of the present disclosure includes; a substrate; a first conductivity type semiconductor layer disposed on the substrate; a mesa including an active layer and a second conductivity type semiconductor layer. The mesa is disposed on a partial region of the first conductivity type semiconductor layer to expose an upper surface of the first conductivity type semiconductor layer along an edge of the first conductivity type semiconductor layer. The light emitting diode chip further includes a lower insulation layer, a pad metal layer, and a reflection structure. The lower insulation layer covering a side surface of the mesa, and extending from the side surface of the mesa to an upper surface of the exposed first conductivity type semiconductor layer. The pad metal layer covers the lower insulation layer and is connected to the first conductivity type semiconductor layer exposed near the side surface of the mesa. The upper insulation layer covers the pad metal layer. The reflection structure is disposed along an edge of the substrate near the side surface of the mesa, and the reflection structure is spaced apart from the lower insulation layer, the pad metal layer and the upper insulation layer. An upper surface of the first conductivity type semiconductor layer exposed near the side surface of the mesa is stepped to have a region having a first elevation and a region having a second elevation lower than the first elevation.

A light emitting diode chip according to another embodiment of the present disclosure includes; a substrate; a first conductivity type semiconductor layer disposed on the substrate; a mesa including an active layer and a second conductivity type semiconductor layer. The mesa is disposed on a partial region of the first conductivity type semiconductor layer to expose an upper surface of the first conductivity type semiconductor layer along an edge of the first conductivity type semiconductor layer. The light emitting diode chip further includes a current blocking layer covering a side surface of the mesa; and a reflection structure spaced apart from the current blocking layer and the first conductivity type semiconductor layer and disposed on the substrate.

According to embodiments of the present disclosure, a reflection structure is disposed on a first conductivity type semiconductor layer or a substrate along an edge of a chip, and thus light loss due to light leakage may be reduced, thereby improving light extraction efficiency. Furthermore, the reflection structure is disposed to be spaced apart from a mesa and layers covering the mesa, and thus it is possible to prevent damage of the reflection structure from being transferred to other adjacent layers even if damage occurs to the reflection structure during a process of dividing chips. As a result, reliability and yield of the light emitting diode chips may be prevented.

BRIEF DESCRIPTION OF DRAWINGS

FIG. 6A is a schematic cross-sectional view illustrating a method of forming a reflection structure according to one embodiment of the present disclosure which includes forming a semiconductor stack on a substrate.

FIG. 6B is a schematic cross-sectional view illustrating the method of forming the reflection structure as shown in FIG. 6A which further includes removing a lower insulation layer.

FIG. 6C is a schematic cross-sectional view illustrating the method of forming the reflection structure as shown in FIG. 6B which further includes forming a stepped structure.

FIG. 6D is a schematic cross-sectional view illustrating the method of forming the reflection structure as shown in FIG. 6C which further includes forming a connector and an upper insulation layer.

FIG. 6E is a schematic cross-sectional view illustrating the method of forming the reflection structure as shown in FIG. 6D which further includes patterning the upper insulation layer.

FIG. 6F is a schematic cross-sectional view illustrating a method of forming a reflection structure according to another embodiment of the present disclosure which includes forming a semiconductor stack on a substrate.

FIG. 7A is a schematic cross-sectional view illustrating a method of forming a reflection structure according to another embodiment of the present disclosure which includes forming a semiconductor stack on a substrate.

FIG. 7B is a schematic cross-sectional view illustrating the method of forming the reflection structure as shown in FIG. 7A which further includes removing a lower insulation layer.

FIG. 7C is a schematic cross-sectional view illustrating the method of forming the reflection structure as shown in FIG. 7B which further includes forming a stepped structure.

FIG. 7D is a schematic cross-sectional view illustrating the method of forming the reflection structure as shown in FIG. 7C which further includes patterning a metal layer.

FIG. 7E is a schematic cross-sectional view illustrating the method of forming the reflection structure as shown in FIG. 7D which further includes removing a metal layer to form a reflection structure.

FIG. 7F is a schematic cross-sectional view illustrating the method of forming the reflection structure as shown in FIG. 7E which further includes forming an upper insulation layer.

DETAILED DESCRIPTION

Figure 1:
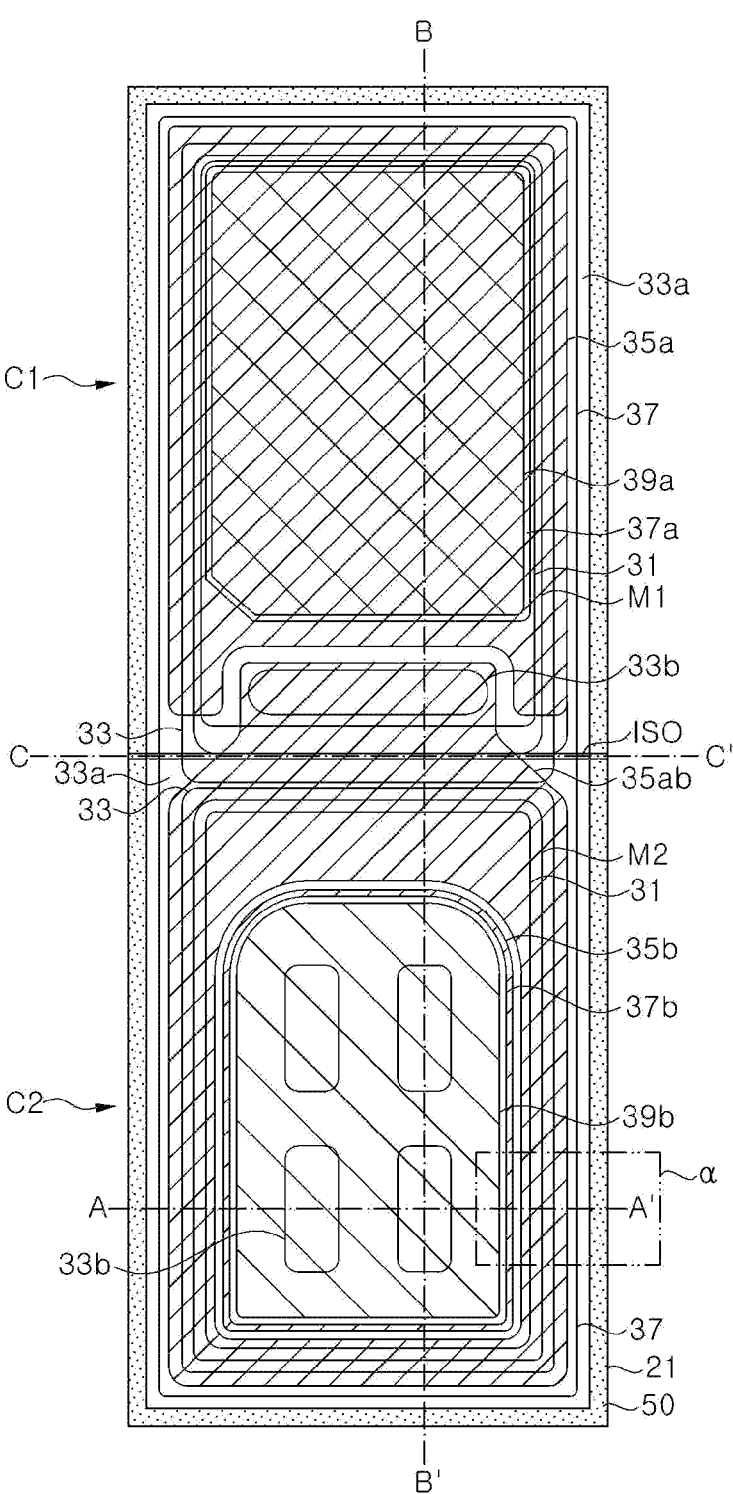
FIG. 1 is a schematic plan view illustrating a light emitting diode chip according to one embodiment of the present disclosure.

Hereinafter, embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

A light emitting diode chip according to one embodiment of the present disclosure may include; a substrate; a first conductivity type semiconductor layer disposed on the substrate; a mesa including an active layer and a second conductivity type semiconductor layer. The mesa is disposed on a partial region of the first conductivity type semiconductor layer to expose an upper surface of the first conductivity type semiconductor layer along an edge of the first conductivity type semiconductor layer. The light emitting diode chip further includes a side coating layer(s) covering a side surface of the mesa; and a reflection structure spaced apart from the side coating layer(s) and disposed on the exposed first conductivity type semiconductor layer.

The reflection structure may have a structure surrounding the mesa along the edge of the first conductivity type semiconductor layer. An upper surface of the first conductivity type semiconductor layer exposed near the side surface of the mesa may be stepped to have a region having a first elevation and a region having a second elevation lower than the first elevation.

Meanwhile, the side coating layer(s) covering the side surface of the mesa may include a lower insulation layer covering the mesa; a pad metal layer covering the lower insulation layer and connected to the exposed first conductivity type semiconductor layer; and an upper insulation layer covering the pad metal layer.

The region having the second elevation may be located between an end portion of the lower insulation layer and an end portion of the reflection structure.

In this case, an end portion of the pad metal layer covering the lower insulation layer and an end portion of the upper insulation layer covering the pad metal layer may be disposed in the region having the second elevation, and the reflection structure may be spaced apart from the end portion of the pad metal layer and the end portion of the upper insulation layer.

Alternatively, the region having the second elevation may be located between the end portion of the lower insulation layer and a side surface of the substrate.

In this case, the reflection structure may be disposed in the region having the second elevation, and may be spaced apart from the end portion of the pad metal layer and the end portion of the upper insulation layer.

Meanwhile, the reflection structure and the lower insulation layer may include the same material layer. Accordingly, the reflection structure and the lower insulation layer may be formed through the same process.

In this case, the reflection structure may include a distributed Bragg reflector, and thus the lower insulation layer may also include the distributed Bragg reflector.

Alternatively, the reflection structure and the pad metal layer may include the same material layer. Accordingly, the reflection structure and the pad metal layer may be formed through the same process.

Meanwhile, the light emitting diode chip according to the present embodiment may further include an ohmic reflection layer being in ohmic contact with the second conductivity type semiconductor layer of the mesa; and a bump pad electrically connected to the pad metal layer.

The ohmic reflection layer may include an ohmic layer disposed on the second conductivity type semiconductor layer; a reflection layer disposed in a form of islands on the ohmic layer; and a cover layer covering the reflection layer, wherein the cover layer contacts the ohmic layer between the reflection layers disposed in the form of islands.

The reflection layer disposed in the form of islands on the ohmic layer may include an insulating material, and thus the reflection layer may serve as a current blocking layer.

The reflection layer may include a $SiO_2$ layer or a distributed Bragg reflector.

The cover layer may include an Ag layer and a Ni layer covering the Ag layer.

Meanwhile, the substrate may be a light transmissive substrate.

In one embodiment, the light emitting diode chip may include a plurality of mesas disposed on the first conductivity type semiconductor layer; and a plurality of reflection structures spaced apart from one another corresponding to the mesas.

In another embodiment, the light emitting diode chip may include: a plurality of light emitting cells spaced apart by a cell isolation region on the substrate; and a plurality of reflection structures spaced apart from one another corresponding to the light emitting cells. Each light emitting cell may include: the first conductivity type semiconductor layer disposed on the substrate; the active layer; and the second conductivity type semiconductor layer. The plurality of reflection structures may include the reflection structures disposed on the first conductivity type semiconductor layers, respectively, and the plurality of reflection structures may be spaced apart from the cell isolation region.

In addition, the reflection structure may be disposed in a form of a plurality of islands.

According to another embodiment of the present disclosure, a light emitting diode chip includes: a substrate; a first conductivity type semiconductor layer disposed on the substrate; a mesa including an active layer and a second conductivity type semiconductor layer. The mesa is disposed on a partial region of the first conductivity type semiconductor layer to expose an upper surface of the first conductivity type semiconductor layer along an edge of the first conductivity type semiconductor layer. The light emitting diode chip further includes a lower insulation layer covering a side surface of the mesa, and extending from the side surface of the mesa to an upper surface of the exposed first conductivity type semiconductor layer; and a pad metal layer covering the lower insulation layer. The pad metal layer is connected to the first conductivity type semiconductor layer exposed near the side surface of the mesa. The light emitting diode chip also includes an upper insulation layer covering the pad metal layer; and a reflection structure disposed along an edge of the substrate near the side surface of the mesa. The reflection structure is spaced apart from the lower insulation layer, the pad metal layer and the upper insulation layer. An upper surface of the first conductivity type semiconductor layer exposed near the side surface of the mesa is stepped to have a region having a first elevation and a region having a second elevation lower than the first elevation.

Meanwhile, the reflection structure and the lower insulation layer may include the same material layer, and the region having the second elevation may be located between an end portion of the lower insulation layer and an end portion of the reflection structure.

Alternatively, the reflection structure and the pad metal layer may include the same material layer, wherein the region having the second elevation may be located between the end portion of the lower insulation layer and a side surface of the substrate, and the reflection structure may be disposed in the region having the second elevation.

A light emitting diode chip according to another embodiment of the present disclosure includes; a substrate; a first conductivity type semiconductor layer disposed on the substrate; a mesa including an active layer and a second conductivity type semiconductor layer. The mesa is disposed on a partial region of the first conductivity type semiconductor layer to expose an upper surface of the first conductivity type semiconductor layer along an edge of the first conductivity type semiconductor layer. The light emitting diode chip further includes a current blocking layer covering a side surface of the mesa; and a reflection structure spaced apart from the current blocking layer and the first conductivity type semiconductor layer and disposed on the substrate.

In addition, the light emitting diode chip may further include: a transparent ohmic layer being in ohmic contact with the second conductivity type semiconductor layer; and a metal reflection layer connected to the transparent ohmic layer. The current blocking layer may have openings disposed between the transparent ohmic layer and the metal reflection layer and exposing the transparent ohmic layer. The metal reflection layer may be connected to the transparent ohmic layer through the openings of the current blocking layer, and the current blocking layer may extend from an upper region of the transparent ohmic layer to cover the side surface of the mesa.

Figure 2:
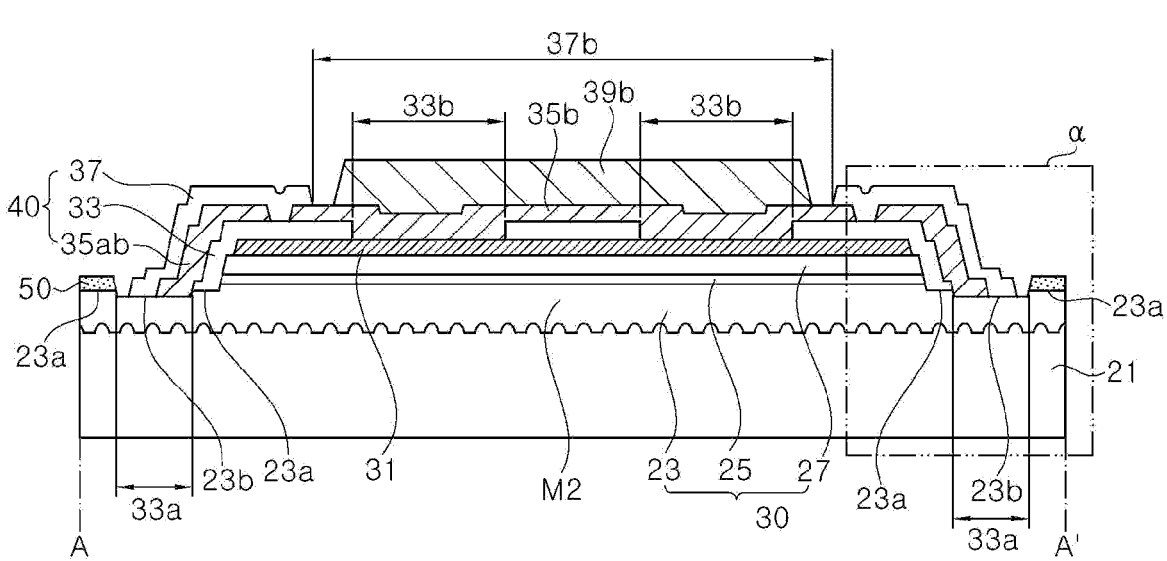
FIG. 2 is a cross-sectional view taken along the line A-A' of FIG. 1
Figure 3:
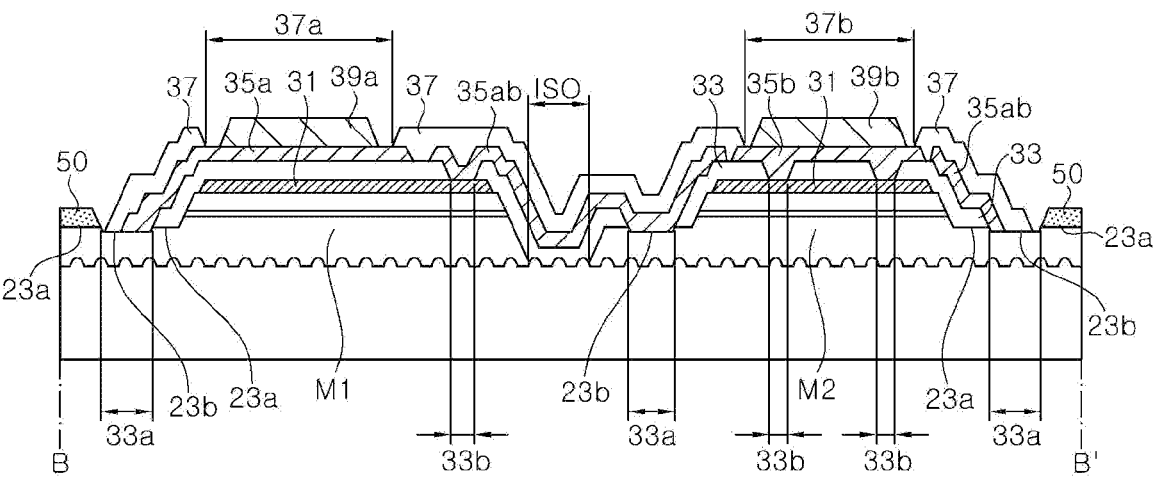
FIG. 3 is a cross-sectional view taken along the line B-B' of FIG. 1.
Figure 4:
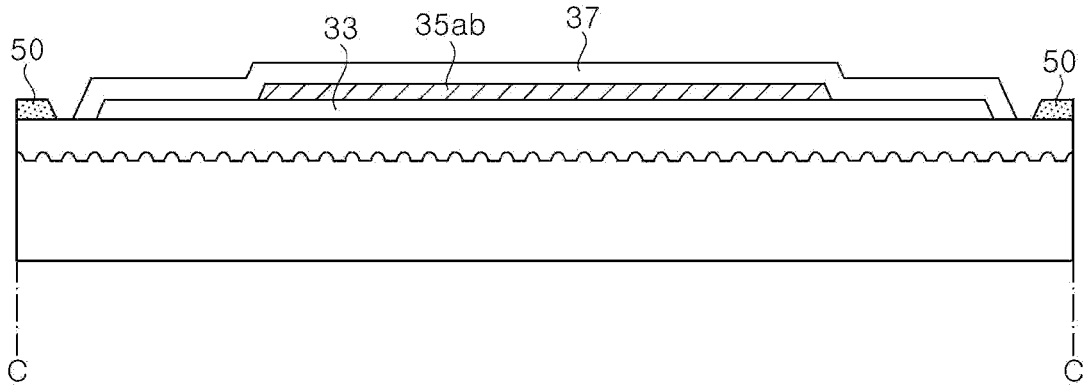
FIG. 4 is a cross-sectional view taken along the line C-C' of FIG. 1.

FIG. 1 is a schematic plan view illustrating a light emitting diode chip according to one embodiment of the present disclosure, FIG. 2 is a cross-sectional view taken along the line A-A' of FIG. 1, FIG. 3 is a cross-sectional view taken along the line B-B' of FIG. 1, and FIG. 4 is a cross-sectional view taken along the line C-C' of FIG. 1.

Referring to FIGS. 1 through 4, the light emitting diode chip according to the present embodiment may include a substrate 21, light emitting cells C1 and C2, an ohmic reflection layer 31, a lower insulation layer 33, and a first pad metal layer 35a, a second pad metal layer 35b, a connector 35ab, an upper insulation layer 37, a first bump pad 39a, a second bump pad 39b and a reflection structure 50. The light emitting cells C1 and C2 may include a semiconductor stack 30 including a first conductivity type semiconductor layer 23, an active layer 25, and a second conductivity type semiconductor layer 27, respectively. A side region a of the light emitting diode chip is located on the line A-A' in the light emitting diode chip of FIGS. 1-2.

The substrate 21 is a light transmissive substrate, and is not particularly limited as long as it is a substrate capable of growing a gallium nitride semiconductor layer. Examples of the substrate 21 may include a sapphire substrate, a gallium nitride substrate, a SiC substrate, or the like, and may be a patterned sapphire substrate. The substrate 21 may have a rectangular or square outer shape as shown in the plan view of FIG. 1, but is not necessarily limited thereto. A size of the substrate 21 is not particularly limited but it may vary.

The light emitting cells C1 and C2 may be disposed to be spaced apart from each other on the substrate 21. Referring to FIG. 1, the light emitting cells C1 and C2 are illustrated as being arranged in a longitudinal direction on the substrate 21 in the present embodiment. However, the arrangement of the light emitting cells C1 and C2 is not limited to that in FIG. 1 of the present disclosure, but various arrangement may be available within the scope of the present disclosure. In addition, although two light emitting cells C1 and C2 are shown in the present embodiment, one or more light emitting cells may be used.

The light emitting cells C1 and C2 may include the semiconductor stack 30 including the first conductivity type semiconductor layer 23, the active layer 25, and the second conductivity type semiconductor layer 27, respectively. The first conductivity type semiconductor layer 23 may be disposed on the substrate 21. The active layer 25 and the second conductivity type semiconductor layer 27 may be disposed in a form of mesas M1 and M2 on a partial region of the first conductivity type semiconductor layer 23 to expose an edge of the first conductivity type semiconductor layer 23. That is, the active layer 25 and the second conductivity type semiconductor layer 27 may be disposed on the first conductivity type semiconductor layer 23 in the form of the mesa through mesa etching. Accordingly, the active layer 25 and the second conductivity type semiconductor layer 27 may have an area smaller than that of the first conductivity type semiconductor layer 23, and a portion of the first conductivity type semiconductor layer 23 may be exposed near side surfaces of the mesas M1 and M2. The active layer 25 is spaced farther from an edge of the substrate 21 than the first conductivity type semiconductor layer 23, and thus, the active layer 25 may be prevented from being damaged in a substrate separation process using a laser.

However, a side surface of the first conductivity type semiconductor layer 23 may be flush with the side surfaces of the mesas M1 and M2 near a portion of edges of the light emitting cell C1. For example, as shown in FIG. 3, the second conductivity type semiconductor layer 27 and the active layer 25 of the light emitting cell C1 may not be etched on a surface where the light emitting cells C1 and C2 face each other, and, accordingly, an upper surface of the first conductivity type semiconductor layer 23 may not be exposed. That is, at an edge facing the light emitting cell C2 among various edges of the light emitting cells C1, the edge of the first conductivity type semiconductor layer 23 and edges of the active layer 25 and the second conductivity type semiconductor layer 27 may be located on the same inclined surface. The light emitting cells C1 and C2 may be electrically connected to each other through the connector 35ab with a cell isolation region (ISO) interposed therebetween. In this case, since the connector 35ab is connected to the second conductivity type semiconductor layer 27 of the light emitting cell C1, on the surface where the light emitting cells C1 and C2 face each other, the first conductivity type 23 of the light emitting cell C1 does not need to be exposed, and thus a light emitting area of the light emitting cell C1 may be secured.

The first conductivity type semiconductor layer 23 may be a gallium nitride-based semiconductor layer doped with an n-type impurity, for example, Si. The second conductivity type semiconductor layer 27 may be a gallium nitride-based semiconductor layer doped with a p-type impurity, for example, Mg. Each of the first conductivity type semiconductor layer 23 and the second conductivity type semiconductor layer 27 may be a single layer, but it may be a multiple layer or a superlattice layer. The active layer 25 may have a single quantum well structure or a multiple quantum well structure. A composition and a thickness of the well layer in the active layer 25 may determine a wavelength of light generated. In particular, it is possible to provide an active layer that generates ultraviolet light, blue light or green light by adjusting the composition of the well layer. The first conductivity type semiconductor layer 23, the active layer 25 and the second conductivity type semiconductor layer 27 may be grown and formed on the substrate 21 in a chamber using a method such as metal organic chemical vapor deposition (MOCVD) or molecular beam epitaxy (MBE).

Meanwhile, the ohmic reflection layer 31 may be disposed on the second conductivity type semiconductor layer 27 of the mesas M1 and M2, and electrically connected to the second conductivity type semiconductor layer 27. The ohmic reflection layer 31 may be disposed over almost an entire region of the second conductivity type semiconductor layer 27 in an upper region of the second conductivity type semiconductor layer 27.

The ohmic reflection layer 31 may include a reflective metal layer, and thus it may reflect light generated in the active layer 25 and traveling to the ohmic reflection layer 31 toward the substrate 21. For example, the ohmic reflection layer 31 may be formed of a single reflective metal layer, but it is not limited thereto. In other embodiments, the ohmic reflection layer 31 may include an ohmic layer and a reflection layer. In some embodiments, a metal layer such as Ni or a transparent oxide layer such as ITO may be used as the ohmic layer, and a metal layer having a high reflectance such as Ag or Al may be used as the reflection layer.

The lower insulation layer 33 may cover the light emitting cells C1 and C2 and the ohmic reflection layer 31. Referring to FIG. 1 and FIG. 2, the lower insulation layer 33 may cover not only upper surfaces of the mesas M1 and C2 but also the side surfaces of the mesas M1 and M2, and may further extend to the side surfaces of the mesas M1 and M2 to cover a portion of the upper surface of the first conductivity type semiconductor layer 23 exposed through mesa etching. The lower insulation layer 33 may also cover the cell isolation region ISO between the light emitting cells C1 and C2.

Meanwhile, the lower insulation layer 33 may include a first opening 33a exposing the first conductivity type semiconductor layer 23 and a second opening 33b exposing the ohmic reflection layer 31.

The first opening 33a may expose at least a portion of the first conductivity type semiconductor layer 23 exposed through mesa etching on the side surfaces of the mesas M1 and M2. In the present embodiment, since the reflection structure 50 and the lower insulation layer 33 include the same material layer and are formed through the same process as described below, the first opening 33a refers to a region between an end portion of the lower insulation layer 33 and an end portion of the reflection structure 50. A process and a structure for forming the first openings 33a will be described in detail with reference to FIG. 6 and FIG. 7.

In the process of forming the first opening 33a, the upper surface of the first conductivity type semiconductor layer 23 exposed through the first opening 33a may be damaged. For example, the first opening 33a may be formed through a dry etching process, and the upper surface of the first conductivity type semiconductor layer 23 exposed through the first opening 33a may be damaged by gases used in the dry etching process. A pad metal layer (for example, the first pad metal layer 35a or the connector 35ab) is connected to the first conductivity type semiconductor layer 23 exposed through the first opening 33a, and, when the pad metal layer is connected to the first conductivity type semiconductor layer 23 in a damaged state, a contact resistance may increase, and thus a forward voltage of the light emitting diode chip may become unstable. Therefore, the damaged upper surface of the first conductivity type semiconductor layer 23 while forming the opening 33a may be etched to prevent the contact resistance from increasing, and thus the forward voltage of the light emitting diode chip may be stabilized.

In this case, the damaged upper surface of the first conductivity type semiconductor layer 23 may be etched to remove a portion thereof, and thus the upper surface of the first conductivity type semiconductor layer 23 may have a stepped structure. Referring to FIG. 2 and FIG. 3, the upper surface of the first conductivity type semiconductor layer 23 exposed near the side surfaces of the mesas M1 and M2 may include a region 23a having a first elevation and a region 23b having a second elevation lower than the first elevation of the region 23a. A step may be formed between the region 23a having the first elevation and the region 23b having the second elevation. The region 23b having the second elevation, as described above, may be formed through etching the damaged upper surface of the first conductivity type semiconductor layer 23 while forming the first opening 33a. Accordingly, a location of the region 23b having the second elevation may be corresponding to that of the first opening 33a.

Meanwhile, the second opening 33b is disposed over the ohmic reflection layer 31 to expose the ohmic reflection layer 31. Referring to FIG. 1 through FIG. 3, the lower insulation layer 33 may include a plurality of second openings 33b. The second opening 33b disposed on the light emitting cell C1 may expose the ohmic reflection layer 31, and the connector 35ab may contact the ohmic reflection layer 31 of the light emitting cell C1 through the second opening 33b. In addition, the second openings 33b disposed on the light emitting cell C2 may expose the ohmic reflection layer 31, and the second pad metal layer 35b may contact the ohmic reflection layer 31 of the light emitting cell C2 through the second openings 33b. However, a location and a shape of the second openings 33b may be variously modified for arrangement and electrical connection of the light emitting cells C1 and C2.

Meanwhile, the lower insulation layer 33 may be formed of a single layer such as $SiO_2$. In other embodiment, it may also include a distributed Bragg reflector in which layers having different refractive indices are alternately stacked.

Figure 5:
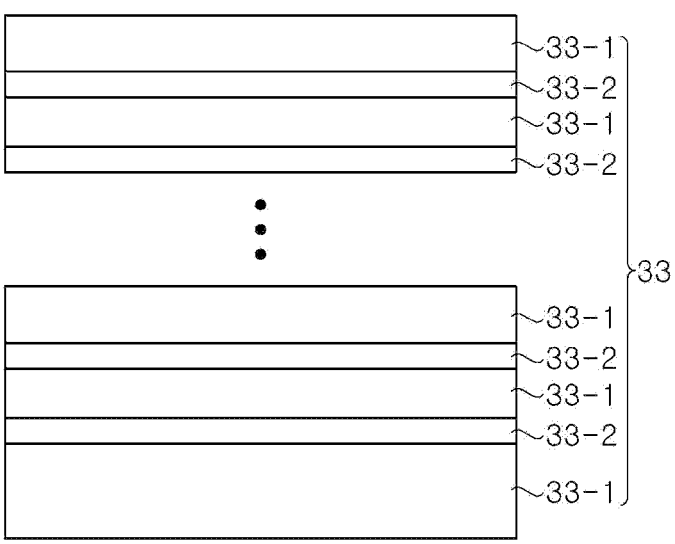
FIG. 5 is a schematic cross-sectional view illustrating a lower insulation layer according to one embodiment of the present disclosure.

FIG. 5 is a schematic cross-sectional view illustrating a lower insulation layer according to one embodiment of the present disclosure. Specifically, FIG. 5 is a schematic cross-sectional view illustrating a lower insulation layer 33 including a distributed Bragg reflector.

Referring to FIG. 5, the lower insulation layer 33 may have a stacked structure in which a first material layer 33-1 and a second material layer 33-2 having different refractive indices are alternately stacked. The first material layer 33-1 may be selected from a $SiO_2$ layer, a $ZrO_2$ layer or an $MgF_2$ layer, and the second material layer 33-2 may be selected from a $TiO_2$ layer, an $Nb_2O_5$ layer, or the like. For example, the first material layer 33-1 may be the $SiO_2$ layer, and the second material layer 33-2 may be the $TiO_2$ layer. Meanwhile, a lowermost layer and an uppermost layer of the lower insulation layer 33 may be the first material layer 33-1, for example, the $SiO_2$ layer, but are not limited thereto, and the lowermost layer, for example, may be a material layer such as the $MgF_2$ having a smaller refractive index than that of $SiO_2$. The lowermost layer may be formed relatively thick to improve adhesion of the lower insulation layer 33 to the mesas M1 and M2 and the first conductivity type semiconductor layer 23, and the uppermost layer may be formed relatively thick to improve adhesion between the first and second pad metal layers 35a and 35b and the connector 35ab formed on the lower insulation layer 33.

A thickness of the lower insulation layer 33 may be limited. This is because, in a case that the lower insulation layer 33 is too thick, patterning is difficult using photolithography and etching techniques. While the lower insulation layer 33 is etched, a photoresist may not withstand but collapses, and when the photoresist is thick, it is difficult to pattern a side surface of the lower insulation layer 33 to have a favorable inclination angle. Accordingly, in consideration of patterning of the lower insulation layer 33, the thickness of the lower insulation layer 33 may be limited to about 2.5 μm or less, specifically 2 μm or less. However, to maintain favorable reflectance, the lower insulation layer 33 may be 1 μm or more, specifically 1.5 μm or more. As a result, the thickness of the lower insulation layer may be limited to in a range of 1 μm to 2.5 μm. Under the above condition, the lower insulation layer 33 may have a reflectance of 90% or more for light having a wavelength of 400 nm to 720 nm.

Meanwhile, as described below, the reflection structure 50 may be formed through the same process as that of the lower insulation layer 33, and thus may include the same material layer. Therefore, the structure of the lower insulation layer 33 disclosed in FIG. 5 may also be applied to the reflection structure 50.

Referring back to FIG. 1 through FIG. 4, the first pad metal layer 35a, the second pad metal layer 35b and the connector 35ab may be disposed on the lower insulation layer 33. As it will be described later, since the connector 35ab is electrically connected to the first conductivity type semiconductor layer 23 and the second conductivity type semiconductor layer 27 as the first pad metal layer 35a and the second pad metal layer 35b, and is formed through the same process as these, it may be referred to as a third pad metal layer. The first pad metal layer 35a may be disposed over the light emitting cell C1, and the second pad metal layer 35b may be disposed over the light emitting cell C2. Meanwhile, the connector 35ab may be disposed over the two light emitting cells C1 and C2, and may electrically connect the light emitting cells C1 and C2 in series. Accordingly, two light emitting cells C1 and C2 may be connected in series by the connector 35ab to form a series array.

In detail, the first pad metal layer 35a may be disposed within an upper region of the light emitting cell C1 and electrically connected to the first conductivity type semiconductor layer 23 exposed near the side surface of the mesa M1. That is, the first opening 33a of the lower insulation layer 33 may expose at least a portion of the first conductivity type semiconductor layer 23 at the side surface of the mesa M1, and the first pad metal layer 35a may be electrically connected to the first conductivity type semiconductor layer 23 through the first opening 33a. As mentioned above, the upper surface of the first conductivity type semiconductor layer 23 exposed near the side surfaces of the mesas M1 and M2 may have the stepped structure including the region 23a having the first elevation and the region 23b having the second elevation. Since the region 23b having the second elevation of the first conductivity type semiconductor layer 23 is exposed through the first opening 33a, the first pad metal layer 35a may be connected to the region 23b having the second elevation. Accordingly, an end portion of the first pad metal layer 35a may be disposed in the region 23b having the second elevation.

In addition, the second pad metal layer 35b may be disposed within an upper region of the light emitting cell C2, and, further, in the upper region of the second conductivity type semiconductor layer 27 of the light emitting cell C2. The second pad metal layer 35b may be electrically connected to the ohmic reflection layer 31 on the light emitting cell C2 through the second opening 33b of the lower insulation layer 33. Meanwhile, the second pad metal layer 35b may be surrounded by the connector 35ab, and, accordingly, a boundary region surrounding the second pad metal layer 35b may be formed between the second pad metal layer 35b and the connector 35ab. This boundary region may expose the lower insulation layer 33.

The connector 35ab (or the third pad metal layer) may electrically connect the light emitting cells C1 and C2. The connector 35ab may be electrically connected to the ohmic reflection layer 31 of the light emitting cell C1 and electrically connected to the second conductivity type semiconductor layer 27, and may also be electrically connected to the first conductivity-type semiconductor layer 23 of the light emitting cell C2 to connect the light emitting cells C1 and C2 in series. Specifically, referring to the cross-sectional view disclosed in FIG. 3, the connector 35ab may be electrically connected to the ohmic reflection layer 31 exposed through the second opening 33b of the lower insulation layer 33 in the light emitting cell C1. In addition, the connector 35ab may be electrically connected to the first conductivity type semiconductor layer 23 exposed near the side surface of the mesa M2 through the first opening 33a of the lower insulation layer 33, in the light emitting cell C2. In this case, as described above, since the region 23b having the second elevation of the first conductivity type semiconductor layer 23 is exposed through the first opening 33a, an end portion of the connector 35ab may be disposed in the region 23b having the second elevation. In addition, the connector 35ab may also cover the cell isolation region ISO between the light emitting cells C1 and C2.

Meanwhile, as shown in FIG. 1, the connector 35ab connects the light emitting cells C1 and C2 in series across the cell isolation region ISO. In this case, a width of the connector 35ab on the cell isolation region ISO is smaller than that of the cell isolation region ISO, and the connector 35ab does not cover an entire cell isolation region ISO. Accordingly, at least both outer portions of the cell isolation region ISO may not be covered by the connector 35ab. Meanwhile, the first pad metal layer 35a may include a recess portion, and the connector 35ab may include a protrusion portion. A partial region of the protrusion of the connector 35a may be narrowed while having an inclination toward the light emitting cell C1, and an end region of the protrusion may be disposed within the recess of the first pad metal layer 35a. Accordingly, a portion of the cell isolation region ISO may not be covered by the connector 35ab within imaginary lines that continuously connect both edges of the mesa of the light emitting cell C1 and both edges of the mesa of the light emitting cell C2. Meanwhile, an end portion located on the light emitting cell C1 may be disposed on the mesa.

The first pad metal layer 35a, the second pad metal layer 35b and the connector 35ab may be formed together with the same material in the same process after the lower insulation layer 33 is formed, and thus they may be located at the same level. Although it is not necessarily limited thereto, the first pad metal layer 35a, the second pad metal layer 35b and the connector 35ab may include a portion located on the lower insulation layer 33, respectively.

The first and second pad metal layers 35a and 35b and the connector 35ab may include a reflection layer such as an Al layer or the like, and the reflection layer may be formed on an adhesive layer such as Ti, Cr, Ni, or the like. In addition, a protective layer having a single layer structure or a multiple layer structure of such as Ni, Cr, Au, or the like may be formed on the reflection layer. The first and second pad metal layers 35a and 35b and the connector 35ab may have, for example, a multiple layer structure of Cr/Al/Ni/Ti/Ni/Ti/Au/Ti.

The upper insulation layer 37 may cover the first and second pad metal layers 35a and 35b and the connector 35ab. In addition, the upper insulation layer 37 may cover an edge of the lower insulation layer 33 along peripheries of the mesas M1 and M2. In addition, the upper insulation layer 37 may cover side surfaces and end portions of the first pad metal layer 35a and the connector 35ab along the peripheries of the mesas M1 and M2. Since the end portion of the first pad metal layer 35a or the end portion of the connector 35ab is disposed in the region 23b having the second elevation of the first conductivity type semiconductor layer 23 through the first opening 33a of the lower insulation layer 33, an end portion of the upper insulation layer 37 covering these may also be disposed in the region 23b having the second elevation of the first conductivity type semiconductor layer 23. Penetration of moisture or the like may be blocked by the upper insulation layer 37 and thus damage to the first pad metal layer 35a and the connector 35ab may be prevented.

Meanwhile, the upper insulation layer 37 may include a first opening 37a exposing the first pad metal layer 35a on the light emitting cell C1. In addition, the upper insulation layer 37 may include a second opening 37b exposing the second pad metal layer 35b on the light emitting cell C2. Except for the first and second openings 37a and 37b, other regions of the light emitting cells C1 and C2 may be covered with the upper insulation layer 37. In particular, both upper and side surfaces of the connector 35ab may be covered with the upper insulation layer 37 and sealed.

The upper insulation layer 37 may be formed of a single layer of $SiO_2$ or $Si_3 N_4$, but it is not limited thereto. For example, the upper insulation layer 37 may have a multiple layer structure including a silicon nitride film and a silicon oxide film. In other embodiments, the upper insulation layer 37 may also include a distributed Bragg reflector in which layers having different refractive indices, such as a $SiO_2$ film, a $TiO_2$ film, a $ZrO_2$ film, a $MgF_2$ film, a $Nb_2$ $O_5$ film, or the like are alternately stacked.

The reflection structure 50 may be disposed on the first conductivity type semiconductor layer 23 exposed through mesa etching, at a location adjacent to the edge of the substrate 21. Referring to FIG. 2 and FIG. 3, as that in this embodiment, when the reflection structure 50 includes the same material layer as the lower insulation layer 33 and is formed through the same process, the reflection structure 50 may be disposed on the region 23a having the first elevation of the first conductivity type semiconductor layer 23. In addition, the reflection structure 50 may be disposed on the substrate 21 in the cell isolation region ISO.

Meanwhile, the reflection structure 50 may have a structure surrounding the mesas M1 and M2 along the edge of the substrate 21 near the side surfaces of the mesas M1 and M2. As shown in FIG. 1, the reflection structure 50 may be disposed in a form of a band surrounding the mesas M1 and M2 along the edge of the substrate 21 according to one embodiment. Alternatively, according to another embodiment, the reflection structure 50 may surround the mesas M1 and M2 along the edge of the substrate 21. In other embodiments, the reflection structure 50 is arranged in a form of a plurality of islands.

The reflection structure 50 is disposed at the edge of the light emitting diode chip and reflects light traveling toward the upper surface of the substrate 21 back to a lower surface of the substrate 21 that is a light exit surface, and thus luminous efficiency of the light emitting diode chip may be improved. Some of light generated in the active layer 25 and entering the first conductivity type semiconductor layer 23 may not reach the light exit surface (for example, the lower surface of the substrate 21) of the light emitting diode chip. But such light may be directed to the upper surface of the first conductivity type semiconductor layer 23 around the mesas M1 and M2, and light emitted through the first conductivity type semiconductor layer 23 is not effectively used and lost. Light may be reflected on an interface between the first conductivity type semiconductor layer 23 and the substrate 21, or on the lower or side surface of the substrate 21, and the light may be directed to the edge of the first conductivity type semiconductor layer 23 that is opposite to the light exit surface. Accordingly, in a case that the reflection structure 50 is not disposed on the edge of the light emitting diode chip as that in the present embodiment, light directed toward the edge of the first conductivity type semiconductor layer 23 is lost. As a result, the luminous efficiency of the light emitting diode chip may be reduced. Therefore, in the present embodiment, the reflection structure 50 is disposed on the first conductivity type semiconductor layer 21 or the substrate 21 (for example, in the cell isolation region ISO) along the edge of the light emitting diode chip, and thus it is possible to reduce light that is lost.

Meanwhile, referring to FIG. 2, a side surface of the reflection structure 50 may be disposed to be flush with the side surface of the substrate 21 and the side surface of the first conductivity type semiconductor layer 23. However, the present disclosure is not limited thereto, and in other embodiments, an outer side surface of the reflection structure 50 may be spaced apart from the side surface of the substrate 21, or the side surface of the first conductivity type semiconductor layer 23 toward the mesas M1 and M2.

Meanwhile, the reflection structure 50 may be spaced apart from the side surfaces of the mesas M1 and M2 and disposed on the first conductivity type semiconductor layer 23, and the reflection structure 50 may also be disposed to be spaced apart from a side coating layer(s) 40 covering the side surfaces of the mesas M1 and M2. Referring to FIG. 2 and FIG. 3, the side surfaces of the mesas M1 and M2 are covered by the side coating layer(s) 40 including the lower insulation layer 33, the connector 35ab (or the first pad metal layer 35a), the upper insulation layer 37, and the like. The side coating layer(s) 40 may extend from the side surfaces of the mesas M1 and M2 to cover the portion of the first conductivity type semiconductor layer 23 exposed through mesa etching. Thus, the end portion of the pad metal layer (for example, the first pad metal layer 35a or the connector 35ab) and the end portion of the upper insulation layer 37 may be disposed on the region 23b having the second elevation of the first conductivity type semiconductor layer 23 disposed between an end portion of the lower insulation layer 33 and an end portion of the reflection structure 50. In this case, the reflection structure 50 is disposed to be spaced apart from an end portion of the side coating layer(s) 40. For example, as shown in FIG. 2 and FIG. 3, the reflection structure 50 may be laterally spaced apart from the end portion of the upper insulation layer 37 disposed on the first conductivity type semiconductor layer 23. Thus, the end portion of the upper insulation layer 37 is disposed in the laterally closest distance to the reflection structure 50, i.e., closer than edges of the lower insulation layer 33 and the connector 35ab as shown in FIGS. 2 and 3.

In addition, as shown in FIG. 4, the reflection structure 50 may be disposed on the substrate 21 in the cell isolation region ISO, and may also be spaced apart from the lower insulation layer 33, the connector 35ab and the upper insulation layer 37. Through this, reliability of the light emitting diode chip may improve as described below. The light emitting diode chips may be formed on a single substrate, and a process of dividing chips into individual light emitting diode chips may be performed by cutting means such as a laser. When the process of dividing the light emitting diode chips using the laser is performed, the laser may be irradiated along a scribing line on the substrate 21. Subsequently, during a breaking process, the substrate 21 and the first conductivity type semiconductor layer 23 are divided, and, at this time, the reflection structure 50 located on or adjacent to the scribing line may be damaged by physical shock. Since the reflection structure 50 is disposed to be spaced apart from the side surfaces of the mesas M1 and M2 and the side coating layer(s) 40, even when the reflection structure 50 is damaged, for example, even when the reflection structure 50 is stripped, it is possible to prevent the side coating layer(s) 40 from being damaged together. That is, during the process of dividing the light emitting diode chips, the physical impact that the reflection structure 50 may receive may be contained in the reflection structure 50, and may not be transferred to the side coating layer(s) 40 disposed adjacent thereto. As a result, reliability and a decrease in yield of the light emitting diode chips may improve or maintained.

In some embodiments, the reflection structure 50 may include the same material layer as the lower insulation layer 33 and be formed through the same process. That is, the reflection structure 50 may include a distributed Bragg reflector having a stacked structure in which a first material layer and a second material layer having different refractive indices are alternately stacked as shown in FIG. 5. In addition, the reflection structure 50 may have a reflectance of 90% or more for light having a wavelength of 400 nm to 720 nm.

However, the reflection structure 50 is not limited to the distributed Bragg reflector, and in other embodiments, the reflection structure 50 may include a metal reflection structure. When the reflection structure 50 includes the metal reflection structure, the reflection structure 50 may include a material layer that is the same as the first and second pad metal layers 35*a* and 35*b* (or the connector 35*ab*) and may be formed through the same process. Related contents will be described in detail with reference to FIG. 7.

Meanwhile, the first bump pad 39*a* (see FIG. 3) may electrically contact the first pad metal layer 35*a* exposed through the first opening 37*a* of the upper insulation layer 37, in the light emitting cell C1. The second bump pad 39*b* electrically contacts the second pad metal layer 35*b* exposed through the second opening 37*b* of the upper insulation layer 37 in the light emitting cell C2, as shown in FIG. 3.

The first bump pad 39*a* and the second bump pad 39*b* are parts that bond light emitting diodes to a submount or a printed circuit board, and are formed of materials suitable for bonding. For example, the first and second bump pads 39*a* and 39*b* may include an Au layer or an AuSn layer.

Although the light emitting diode having two light emitting cells C1 and C2 has been described above, the number of light emitting cells may vary such as one, or more than two. In addition, the structure of the light emitting diode will be more clearly understood through a method of manufacturing the light emitting diode described below.

FIGS. 6A through 6F show schematic cross-sectional views illustrating a method of forming a reflection structure according to one embodiment of the present disclosure. In particular, when the reflection structure includes the same material layer as a lower insulation layer, a structure and a formation process of the reflection structure and a side coating layer(s) disposed adjacent thereto can be understood through FIGS. 6A through 6F. For example, FIGS. 6A through 6F can illustrate a process of forming a side region a of the light emitting diode chip located on the line A-A' in the light emitting diode chip of FIG. 1.

Figure 6A:
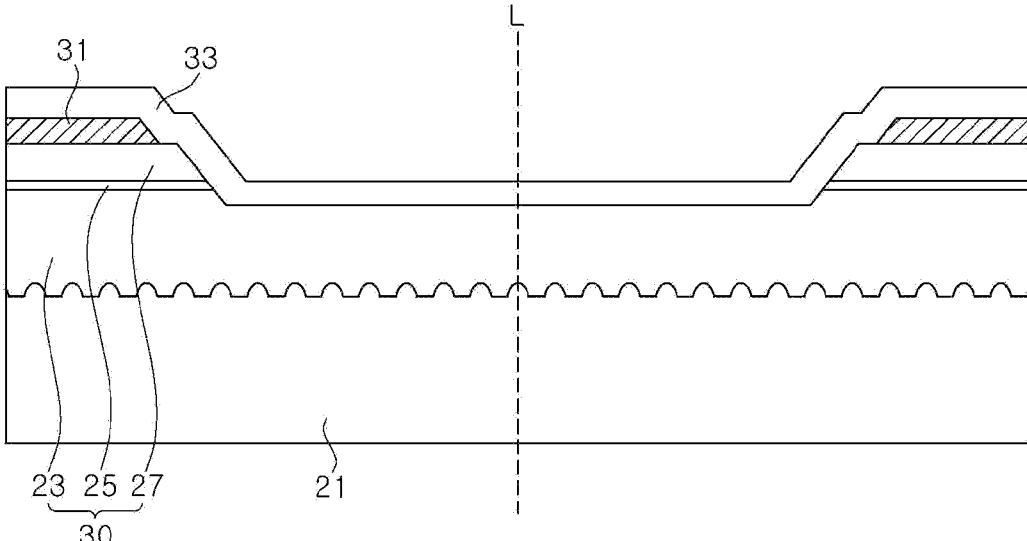
FIGS. 6A through 6F show schematic cross-sectional views illustrating a method of forming a reflection structure according to one embodiment of the present disclosure where.
Figure 6B:
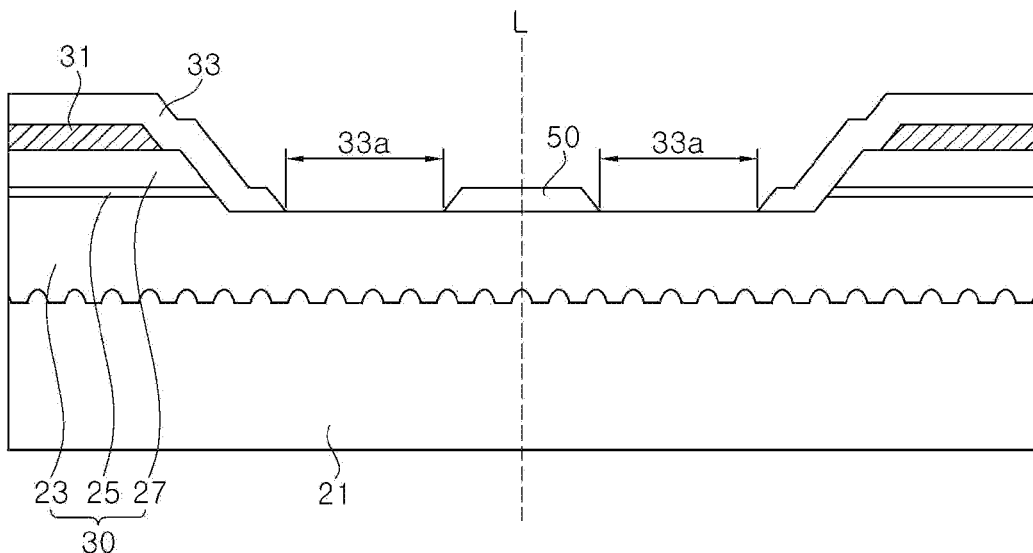
Figure 6C:
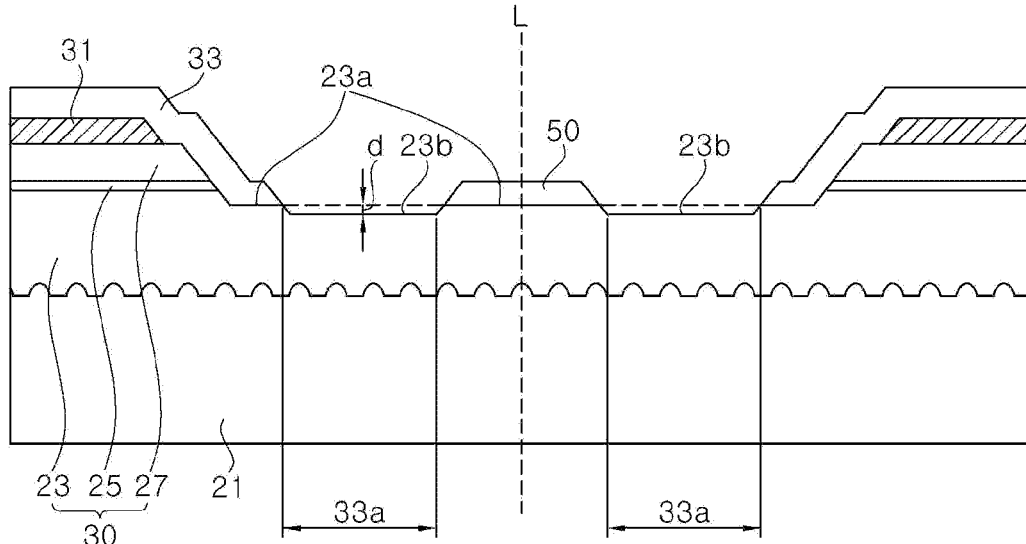
Figure 6D:
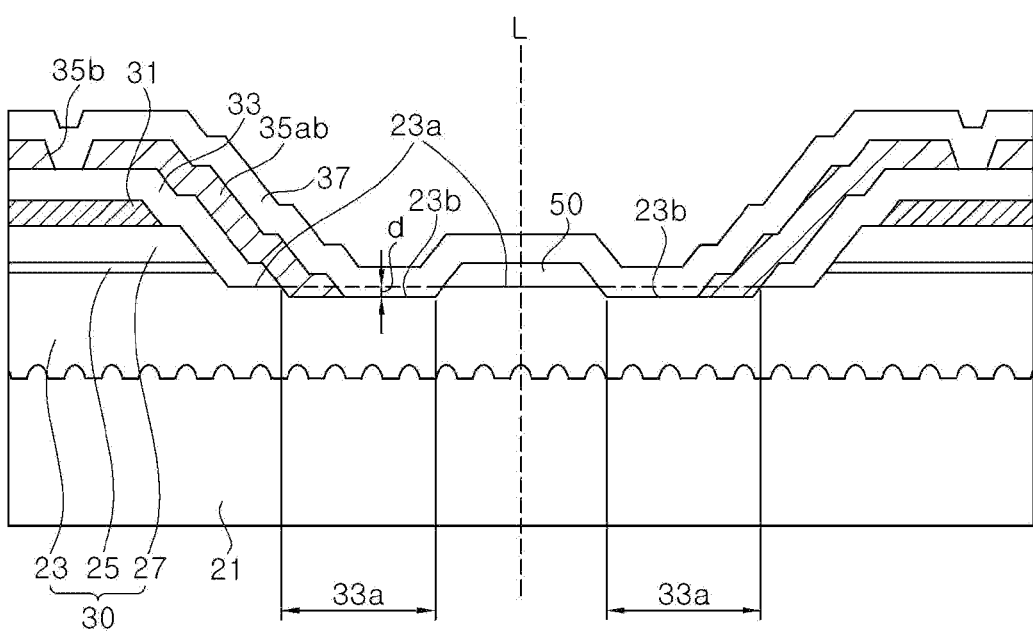
Figure 6E:
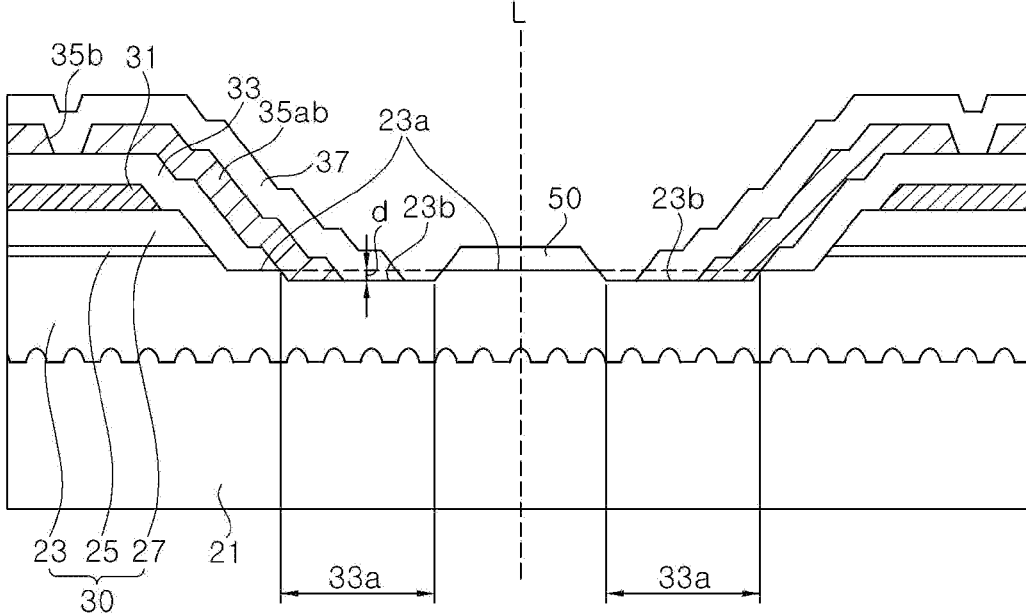
Figure 6F:
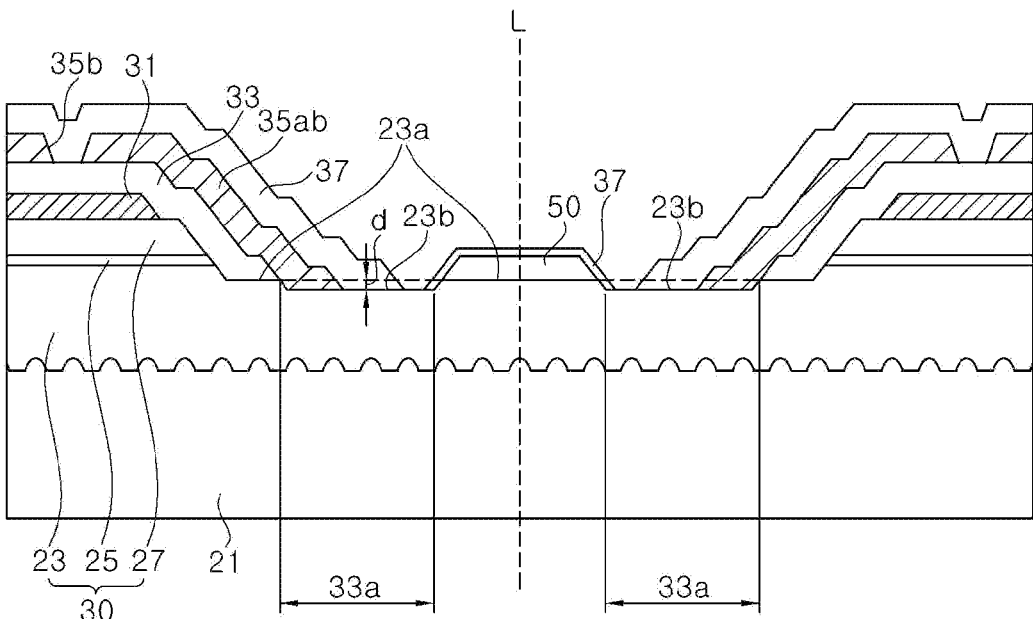

FIG. 6A is a schematic cross-sectional view illustrating a method of forming a reflection structure according to one embodiment of the present disclosure which includes forming a semiconductor stack on a substrate. FIG. 6B is a schematic cross-sectional view illustrating the method of forming the reflection structure as shown in FIG. 6A which further includes removing a lower insulation layer. FIG. 6C is a schematic cross-sectional view illustrating the method of forming the reflection structure as shown in FIG. 6B which further includes forming a stepped structure. FIG. 6D is a schematic cross-sectional view illustrating the method of forming the reflection structure as shown in FIG. 6C which further includes forming a connector and an upper insulation layer. FIG. 6E is a schematic cross-sectional view illustrating the method of forming the reflection structure as shown in FIG. 6D which further includes patterning the upper insulation layer. FIG. 6F is a schematic cross-sectional view illustrating a method of forming a reflection structure according to another embodiment of the present disclosure which includes forming a semiconductor stack on a substrate.

Referring to FIG. 6A, a semiconductor stack 30 including a first conductivity type semiconductor layer 23, an active layer 25 and a second conductivity type semiconductor layer 27 may be formed first on a substrate 21, and mesas including the active layer 25 and the second conductivity type semiconductor layer 27 may be formed through mesa etching. Mesas may be formed on both sides of a scribing line L.

After the mesa etching process, an ohmic reflection layer 31 is formed on the mesa, and then a lower insulation layer 33 covering the mesa, the ohmic reflection layer 31 and the first conductivity type semiconductor layer 23 exposed through the mesa etching 33 is formed.

Meanwhile, a portion of the lower insulation layer 33 may be etched. For example, the portion of the lower insulation layer 33 may be removed through a dry etching process. Referring to FIG. 6B, the portion of the lower insulation layer 33 covering the first conductivity type semiconductor layer 23 may be removed to form a first opening 33*a*. Of course, although there is a region where the lower insulation layer 33 is removed to form a second opening 33*b*, the description herein will be given mainly on formation of a side region of the chip. In this case, the lower insulation layer 33 located on the scribing line L may not be removed. A portion of the lower insulation layer 33 left on the scribing line L is used as a reflection structure 50. In addition, the lower insulation layer 33 covering a side surface of the mesa and a portion of the lower insulation layer 33 extending from thereof toward the first conductivity type semiconductor layer 23 may not be removed.

When the lower insulation layer 33 is removed through the etching process, an upper surface of the first conductivity type semiconductor layer 23 exposed through the first opening 33*a* as shown in FIG. 6B may be damaged. For example, the lower insulation layer 33 is removed through the dry etching process, and, in this case, the upper surface of the first conductivity type semiconductor layer 23 exposed through the first opening 33*a* by gases used for dry etching may be damaged. As mentioned above, a first pad metal layer 35*a* and/or a connector 35*ab* is connected to the first conductivity type semiconductor layer 23 exposed through the first opening 33*a*, and, in a case that the first pad metal layer 35*a* and/or the connector 35*ab* is connected to a damaged first conductivity type semiconductor layer 23, contact resistance increases. Accordingly, it is necessary to remove the damaged surface of the first conductivity type semiconductor layer 23 to prevent an increase in contact resistance.

Referring to FIG. 6C, the surface of the first conductivity type semiconductor layer 23 exposed through the first opening 33*a* is etched, and thus a step may be formed. That is, the upper surface of the first conductivity type semiconductor layer 23 may include a stepped structure including a region 23*a* having a first elevation and a region 23*b* having a second elevation. In this case, the region 23*b* having the second elevation may have a predetermined depth d to an extent that the damaged upper surface of the first conductivity type semiconductor layer 23 may be removed. In addition, the region 23*b* having the second elevation may be corresponding to a location of the first opening 33*a*. Since the lower insulation layer 33 and the reflection structure 50 are formed through the same process in the present embodiment, the lower insulation layer 33 on the scribing line L is not removed, and thus the first opening 33*a* may be disposed between an end portion of the lower insulation layer 33 and an end portion of the reflection structure 50. Accordingly, the region 23*b* having the second elevation may also be disposed between the end portion of the lower insulation layer 33 and the end portion of the reflection structure 50, as shown in FIG. 6C.

Referring to FIG. 6D, a second pad metal layer 35*b* and a connector 35*ab* may be formed to cover the lower insulation layer 33. The connector 35*ab* is patterned to be connected to the first conductivity type semiconductor layer 23 exposed in a region where the lower insulation layer 33 is removed. That is, the connector 35*ab* may cover the lower insulation layer 23, and may further extend into the region 23*b* having the second elevation of the first conductivity type semiconductor layer 23 to cover a portion of the first conductivity type semiconductor layer 23. Although not shown in FIG. 6D, the first pad metal layer 35*a* may also be formed together with the second pad metal layer 35*b* and the connector 35*ab*, and the first pad metal layer 35*a* may have the same shape as that of the connector 35*ab*.

An upper insulation layer 37 may be formed on the first and second pad metal layers 35*a* and 35*b* and the connector 35*ab*. In addition, the upper insulation layer 37 may be formed to cover the reflection structure 50 located on the scribing line L, and the first conductivity type semiconductor layer 23 exposed between an end portion of the connector 35*ab* and the reflection structure 50.

Meanwhile, the upper insulation layer 37 may be etched and patterned. Referring to FIG. 6E, the upper insulation layer 37 covering the reflection structure 50 located on the scribing line L may be completely removed according to one embodiment, and remaining portions of the upper insulation layer 37 and the reflection structure 50 may be spaced apart from each other. Accordingly, an end portion of the upper insulation layer 37 may be disposed in the region 23*b* having the second elevation of the first conductivity type semiconductor layer 23, but the end portion may be spaced apart from the reflection structure 50. In this case, a portion of an upper surface of the reflection structure 50 may be removed together with the upper insulation layer 37.

Using a laser or the like, along the scribing line L, light emitting diode chips located at both sides thereof may be divided into individual chips. For example, the laser is irradiated onto the substrate 21 and the first conductivity type semiconductor layer 23 along the scribing line L, and then the light emitting diode chips may be divided into individual chips through a breaking process. In a process of dividing chips, the reflection structure 50 located on the scribing line L may be subjected to physical shock. At this time, to prevent the physical shock received by the reflection structure 50 from being transmitted to another configuration of the chip, for example, the upper insulation layer 37, i.e., an end portion thereof, disposed closest to the reflection structure 50 as shown in FIGS. 2 and 3, the reflection structure 50 and the upper insulation layer 37 are spaced apart.

Meanwhile, referring to FIG. 6F, according to another embodiment of the present disclosure, when the upper insulation layer 37 covering the reflection structure 50 is removed, a portion of the upper insulation layer 37 may be left. Accordingly, in the process of removing the upper insulation layer 37 through etching, it is possible to prevent the reflection structure 50 disposed under thereof from being damaged or etched. In addition, the upper insulation layer 37 remaining on the reflection structure 50 may complement the reflection structure 50 to increase the light reflection efficiency. However, even in this case, the upper insulation layer 37 covering the connector 35*ab* may be spaced apart from the reflection structure 50 or the upper insulation layer 37 remaining on the reflection structure 50.

FIGS. 6A through 6F show the partial region a of a side surface of the light emitting diode chip, but this structure may be applied to other regions of the side surface of the light emitting diode chip. Referring back to FIG. 2, a represents a partial region such as a side region of a light emitting diode chip.

FIGS. 7A through 7F show schematic cross-sectional views illustrating a method of forming a reflection structure according to another embodiment of the present disclosure. The reflection structure according to the present embodiment may include a metal reflection layer. A process of forming the reflection structure and a process of dividing the light emitting diode chips according to the present embodiment are substantially the same as those disclosed in FIGS. 6A through 6F except that the reflection structure includes the same material layer as a pad metal layer. The differences are described below.

Figure 7A:
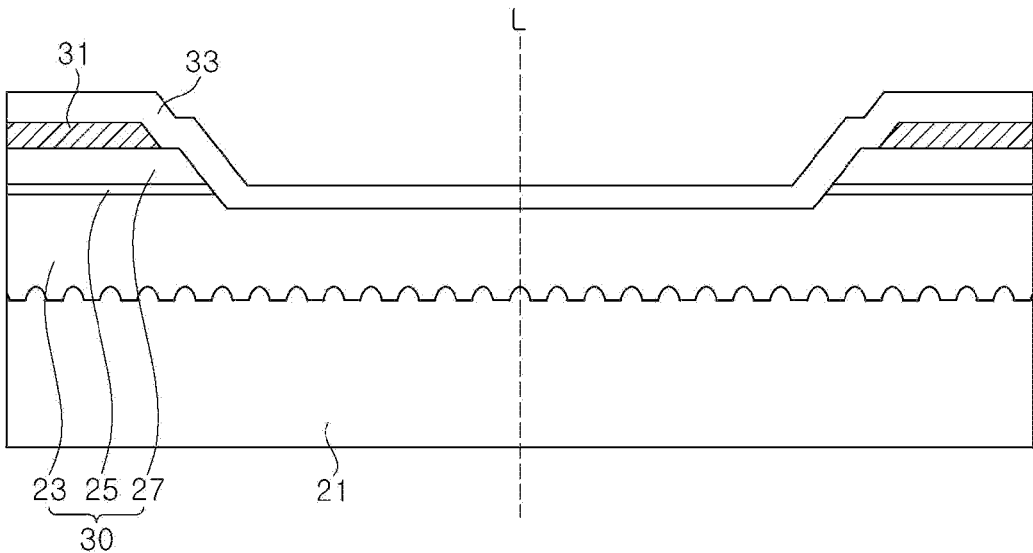
FIGS. 7A through 7F show schematic cross-sectional views illustrating a method of forming a reflection structure according to another embodiment of the present disclosure where.
Figure 7B:
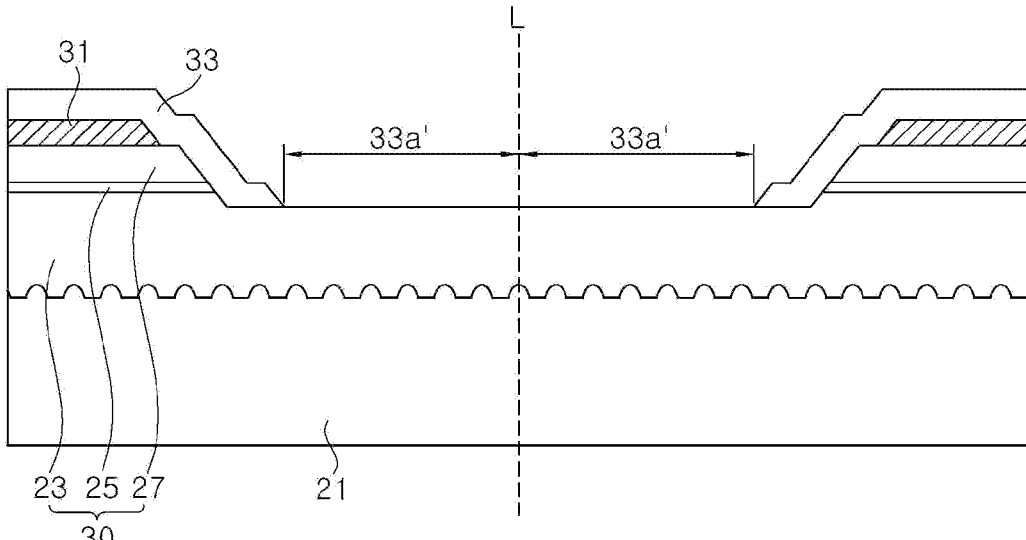
Figure 7C:
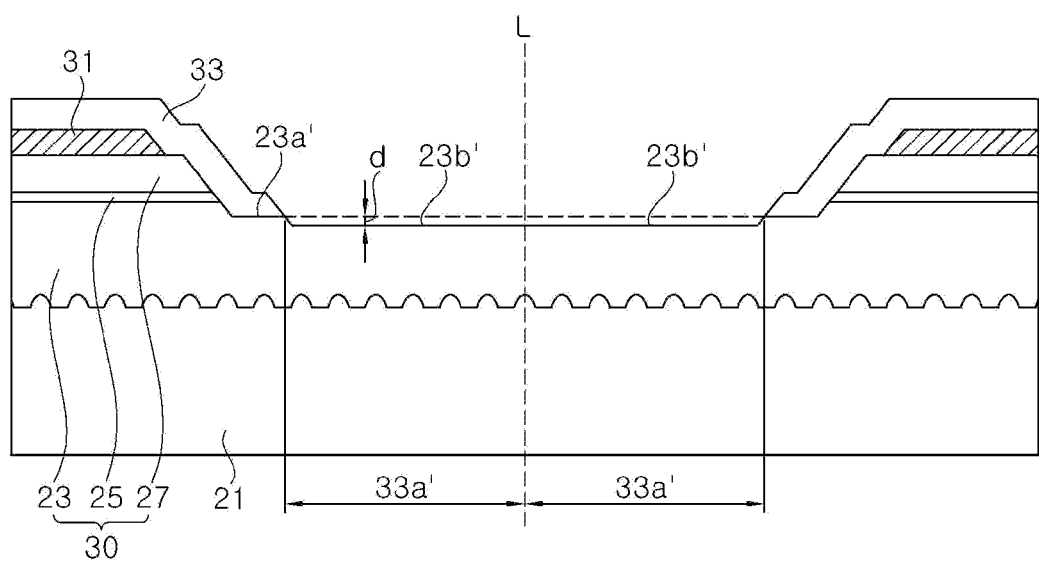
Figure 7D:
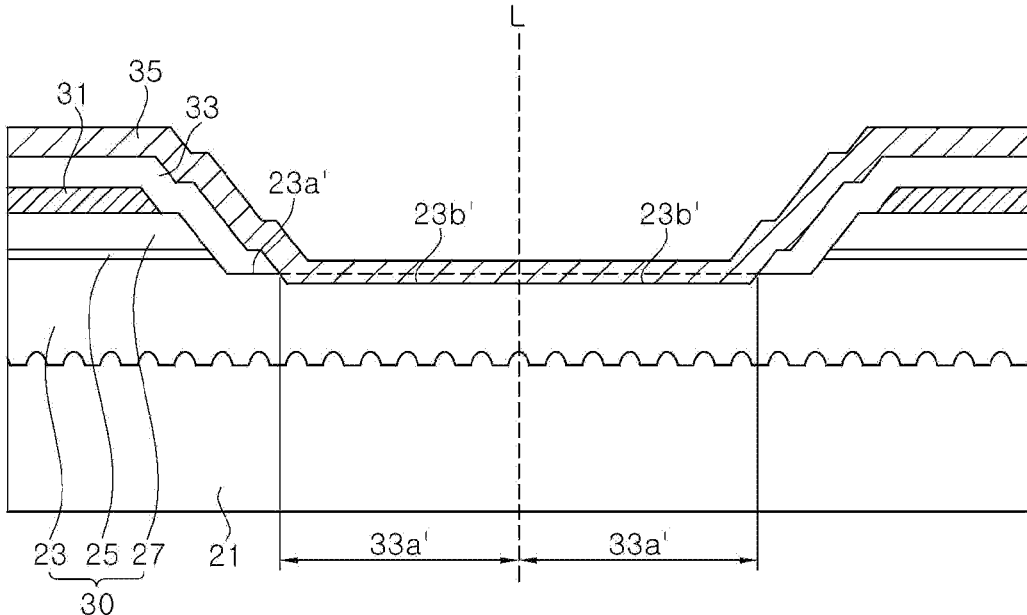
Figure 7E:
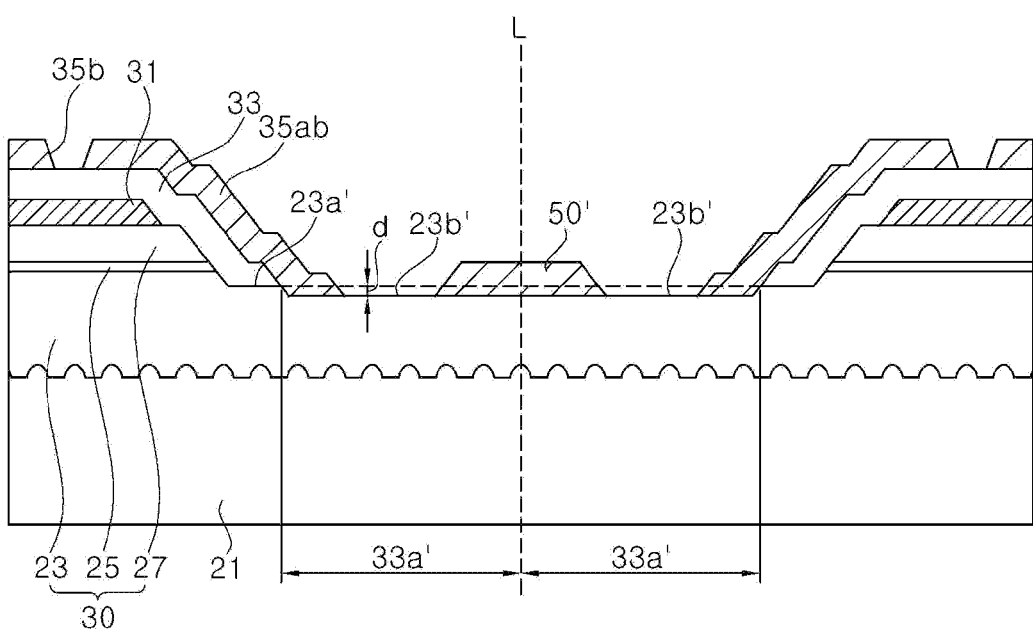
Figure 7F:
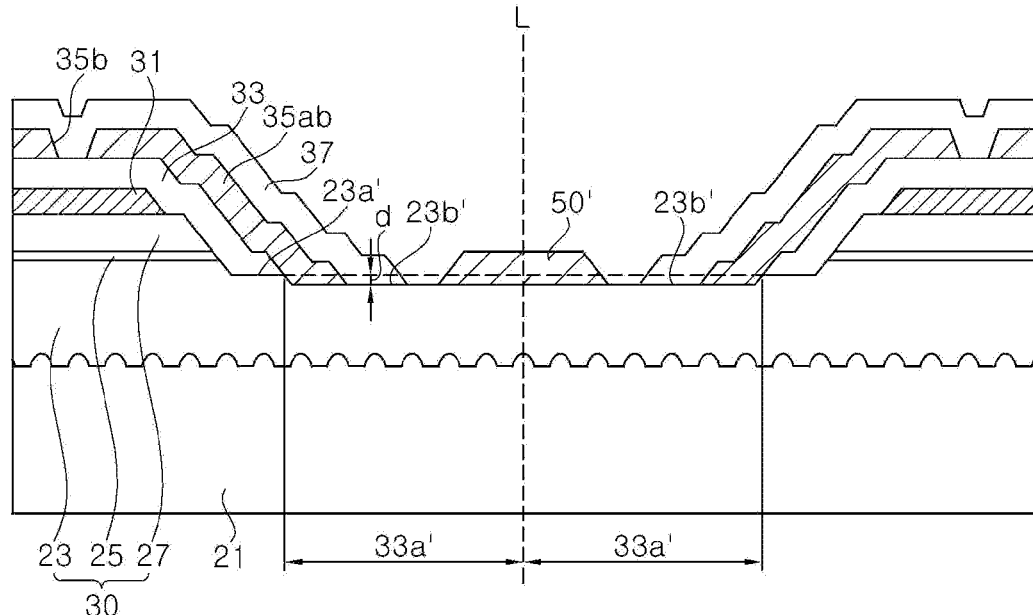

FIG. 7A is a schematic cross-sectional view illustrating a method of forming a reflection structure according to another embodiment of the present disclosure which includes forming a semiconductor stack on a substrate. FIG. 7B is a schematic cross-sectional view illustrating the method of forming the reflection structure as shown in FIG. 7A which further includes removing a lower insulation layer. FIG. 7C is a schematic cross-sectional view illustrating the method of forming the reflection structure as shown in FIG. 7B which further includes forming a stepped structure. FIG. 7D is a schematic cross-sectional view illustrating the method of forming the reflection structure as shown in FIG. 7C which further includes patterning a metal layer. FIG. 7E is a schematic cross-sectional view illustrating the method of forming the reflection structure as shown in FIG. 7D which further includes removing a metal layer to form a reflection structure. FIG. 7F is a schematic cross-sectional view illustrating the method of forming the reflection structure as shown in FIG. 7E which further includes forming an upper insulation layer.

Referring to FIG. 7A, a semiconductor stack 30 may be formed first on a substrate 21, and mesas including an active layer 25 and a second conductivity type semiconductor layer 27 may be formed through mesa etching. The mesas may be formed on both sides of a scribing line L. After the mesa etching process, an ohmic reflection layer 31 is formed on the mesa, and then a lower insulation layer 33 covering the mesa, the ohmic reflection layer 31 and a first conductivity type semiconductor layer 23 exposed through mesa etching is formed.

Meanwhile, a portion of the lower insulation layer 33 may be etched. The portion of the lower insulation layer 33 may be removed through a dry etching process. Referring to FIG. 7B, the portion of the lower insulation layer 33 covering the first conductivity type semiconductor layer 23 is removed to form a first opening 33*a*'. In this case, unlike that in the embodiment of FIG. 6, the lower insulation layer 33 disposed on the scribing line L is also removed. That is, in the embodiment of FIG. 6, the lower insulation layer 33 and the reflection structure 50 are formed through the same process, as they include the same material layer. However, in the present embodiment, since the reflection structure 50 is formed of a material different from that of the lower insulation layer 33, it is not necessary to leave the lower insulation layer 33 on the scribing line L. Accordingly, unlike that in the embodiment of FIG. 6, a shape of the first opening 33*a*' is also different from that of the lower insulation layer 33, and the first opening 33*a*' is formed from an end portion of the lower insulation layer 33 to the scribing line L (to a side surface of the substrate or a side surface of the first conductivity type semiconductor layer after dividing the chips).

When the lower insulation layer 33 is removed through an etching process, an upper surface of the first conductivity type semiconductor layer 23 exposed through the first opening 33$a'$ as shown in FIG. 7B may be damaged. For example, the lower insulation layer 33 is removed through the dry etching process, and, at this time, the upper surface of the first conductivity type semiconductor layer 23 exposed through the first opening 33$a'$ by gases used for dry etching may be damaged.

Referring to FIG. 7C, the surface of the first conductivity type semiconductor layer 23 exposed through the first opening 33$a'$ is etched, and thus a step may be formed. That is, the upper surface of the first conductivity type semiconductor layer 23 may include a stepped structure including a region 23$a'$ having a first elevation and a region 23$b'$ having a second elevation. In this case, a location of the region 23$b'$ having the second elevation may correspond to that of the first opening 33$a'$.

Referring to FIG. 7D, a metal layer 35 covering the lower insulation layer 33 and the first conductivity type semiconductor layer 23 is formed. The metal layer 35 may include a reflection layer such as an Al layer, and the reflection layer may be formed on an adhesive layer such as Ti, Cr, Ni, or the like. In addition, a protective layer having a single layer or a multiple layer structure such as Ni, Cr, Au, or the like may be formed on the reflection layer. The metal layer 35 may have, for example, a multiple layer structure of Cr/Al/Ni/Ti/Ni/Ti/Au/Ti.

Referring to FIG. 7D, the metal layer 35 may be patterned through photolithography and etching to form a second pad metal layer 35$b$, a connector 35$ab$ and a reflection structure 50$'$. That is, in the present embodiment, when the metal layer 35 is patterned, the metal layer 35 located on the scribing line L may not be removed, and a remaining metal layer 35 may be used as the reflection structure 50$'$, as shown in FIG. 7E. As a result, the reflection structure 50$'$ may be disposed on the region 23$b'$ having the second elevation of the first conductivity type semiconductor layer 23, as shown in FIG. 7E.

Referring to FIG. 7F, an upper insulation layer 37 may be formed on first and second pad metal layers 35$a$ and 35$b$ and a connector 35$ab$ and patterned. In this case, the upper insulation layer 37 and the reflection structure 50$'$ may be spaced apart from each other.

Figure 8:
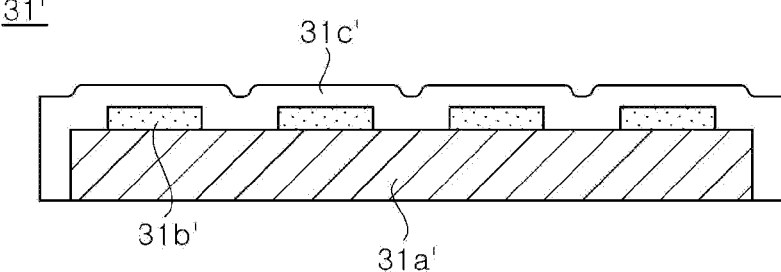
FIG. 8 is a schematic cross-sectional view illustrating an ohmic reflection layer according to another embodiment of the present disclosure.

FIG. 8 is a schematic cross-sectional view illustrating an ohmic reflection layer according to another embodiment of the present disclosure. Referring to FIG. 8, an ohmic reflection layer 31$'$ according to the present embodiment is different from the ohmic reflection layer 31 described above in that it includes an ohmic layer 31$'a$, an insulation layer 31$'b$ and a reflection layer 31$'c$.

The ohmic layer 31$'a$ is a layer for forming an ohmic contact with a second conductivity type semiconductor layer 27, and may include a transparent oxide layer such as ITO, ZnO, or the like. The insulation layer 31$'b$ is disposed on the ohmic layer 31$'a$ in a form of a plurality of islands or having a plurality of holes to expose the ohmic layer 31$'a$. The insulation layer 31$'b$ may be formed of a single material such as SiO$_2$ or the like. Alternatively, the insulation layer 31$'b$ may include a distributed Bragg reflector in which layers having different refractive indices are alternately stacked. The reflection layer 31$'c$ may cover the ohmic layer 31$'a$ and the insulation layer 31$'b$ and contact the ohmic layer 31$'a$ exposed through the insulation layer 31$'b$. A connector 35$ab$ or a second pad metal layer 35$b$ is connected to the reflection layer 31$'c$, and thus may be electrically connected to the second conductivity type semiconductor layer 27 of light emitting cells C1 and C2. According to a structure of the ohmic reflection layer in this embodiment, since the insulation layer 31$'b$ functions as a current blocking layer between the ohmic layer 31$'a$ and the reflection layer 31$'c$, current spreading capability of the light emitting diode may be improved. The reflection layer 31$'c$ may include a metal having a high reflectance, for example, Ag, and thus may reflect light between the insulation layers 31$'b$ arranged in the form of islands, and may further reflect light transmitted through the insulation layer 31$'b$. In addition, the reflection layer 31$'c$ may have a dual structure further including a barrier layer for blocking the diffusion of Ag. The barrier layer may include a metal such as Ni.

According to the present embodiment, since the insulation layer 31$'b$ is disposed between the ohmic layer 31$'$ a of the transparent oxide and the metal reflection layer 31$'b$, reflectance of the ohmic reflection layer 31$'$ may be increased, and thus the luminous efficiency of the light emitting diode chip may be improved.

Figure 9:
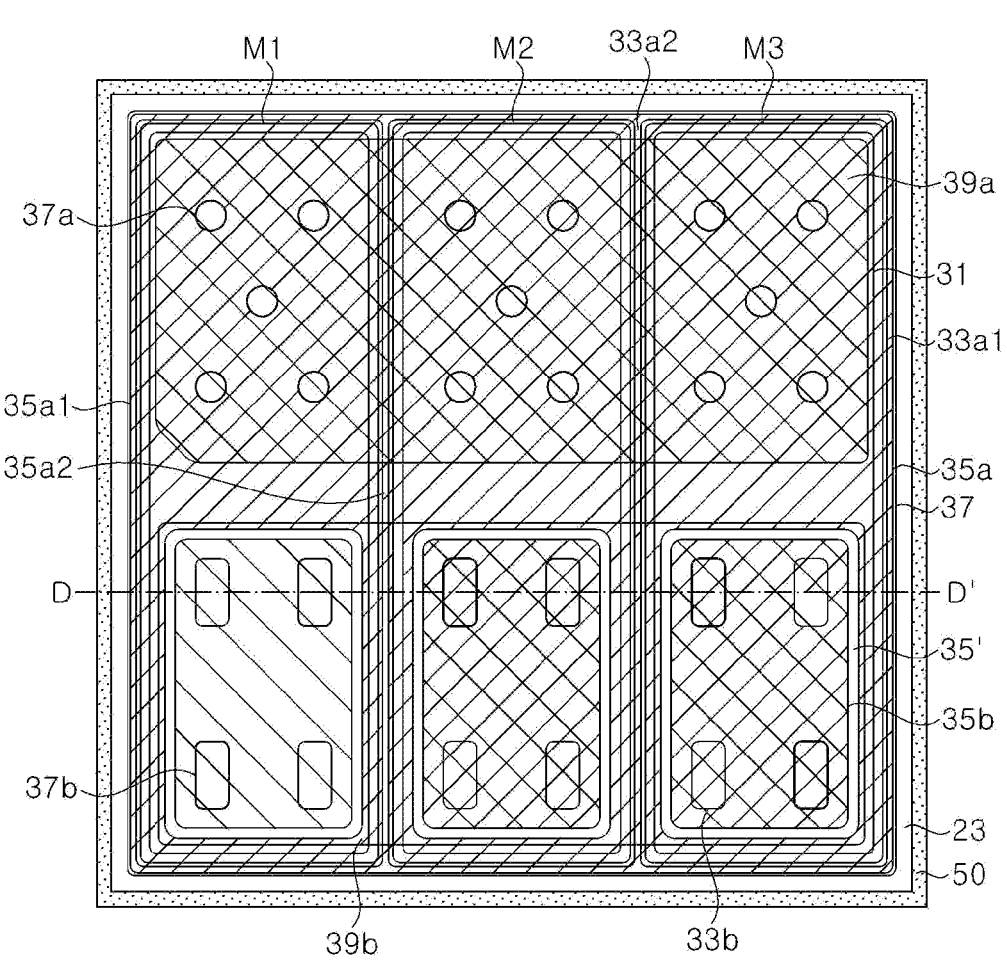
FIG. 9 is a schematic plan view illustrating a light emitting diode chip according to another embodiment of the present disclosure.
Figure 10:
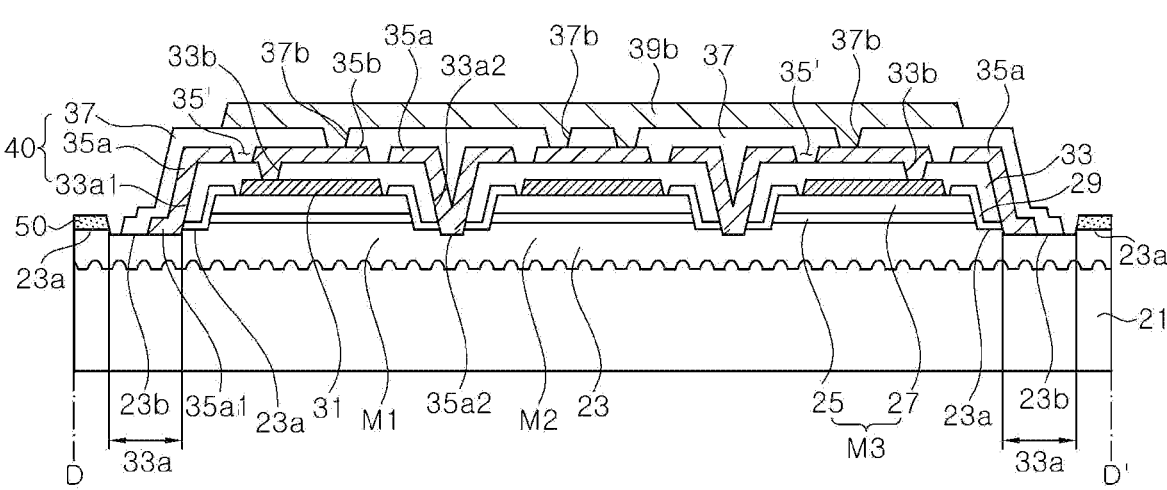
FIG. 10 is a cross-sectional view taken along the line D-D' of FIG. 9.

FIG. 9 is a schematic plan view illustrating a light emitting diode chip according to another embodiment of the present disclosure, and FIG. 10 is a cross-sectional view taken along the line D-D$'$ of FIG. 9. The light emitting diode chip according to the present embodiment has the same or similar configuration as that of the light emitting diode chip shown in FIG. 1 except that a single light emitting cell includes a plurality of mesas, further includes a preliminary insulation layer, and shapes of the ohmic reflection layer, the first and second pad metal layers, and the bump pad are different.

The light emitting diode chip according to the present embodiment includes a plurality of mesas M1, M2, and M3 disposed on a single substrate. The mesas M1, M2, and M3 include an active layer and a second conductivity type semiconductor layer, respectively, but the mesas M1, M2, and M3 share a single first conductivity type semiconductor layer continuously connected under the mesas M1, M2, and M3. The mesas M1, M2, and M3 may be disposed to be flush with one another longitudinally.

Accordingly, the shapes of the ohmic reflection layer 31 and the first and second pad metal layers 35$a$ and 35$b$ are modified. The ohmic reflection layer 31 may be disposed on each of the mesas M1, M2, and M3 to be in ohmic contact with each of the second conductivity type semiconductor layers 27. The ohmic reflection layers 31 may be disposed within upper regions of the mesas M1, M2, and M3, and may be spaced apart from one another.

The light emitting diode chip according to the present embodiment may further include a preliminary insulation layer 29 covering the mesas M1, M2, and M3 around the ohmic reflection layers 31. The preliminary insulation layer 29 may be formed of, for example, SiO$_2$, and may cover side surfaces of the mesas M1, M2, and M3 and further cover a partial region of the first conductivity type semiconductor layer 23.

Meanwhile, a lower insulation layer 33 may cover the mesas M1, M2, and M3 and the ohmic reflection layers 31. The lower insulating layer 33 may have first openings 33$a$1 exposing the first conductivity type semiconductor layer 23 along an edge of the substrate 21 and first openings 33$a$2 exposing the first conductivity type semiconductor layer 23 among the mesas M1, M2, and M3, as shown in FIGS. 9 and 10.

The lower insulation layer 33 also has second openings 33$b$ exposing the ohmic reflection layer 31 on each of the mesas M1, M2, and M3. A shape of the second openings 33$b$ may be an elongated rounded rectangular shape as shown in FIG. 9, but it is not limited thereto and may have various shapes.

A first pad metal layer 35*a* covers the mesas M1, M2, and M3 and is electrically connected to the first conductivity type semiconductor layer 23 through the first openings 33*a*1 and 33*a*2. The first pad metal layer 35*a* may include an external contact portion 35*a*1 contacting the first conductive semiconductor layer 23 through the first opening 33*a*1 and internal contact portions 35*a*2 contacting the first conductivity type semiconductor layer 23 through the first openings 33*a*2 among the mesas M1, M2, and M3.

Meanwhile, second pad metal layers 35*b* are disposed on the mesas M1, M2, and M3, respectively. Each of the second pad metal layers 35*b* may be surrounded by the first pad metal layer 35*a*, and thus a ring-shaped boundary 35' may be formed on each of the mesas M1, M2, and M3. The second pad metal layers 35*b* are electrically connected to the ohmic reflection layers 31 on the mesas M1, M2, and M3 through the second openings 33*b* of the lower insulation layer 33.

An upper insulation layer 37 covers the first pad metal layer 35*a* and the second pad metal layer 35*b*, and includes first openings 37*a* exposing the first pad metal layer 35*a* and second openings 37*b* exposing the second pad metal layer 35*b*. The second pad metal layer 35*b* on each of the mesas M1, M2, and M3 is exposed through the second openings 37*b*. The first openings 37*a* may also be disposed on each of the mesas M1, M2, and M3.

Meanwhile, a first bump pad 39*a* and a second bump pad 39*b* may be formed over the mesas M1, M2, and M3, respectively. The first bump pad 39*a* is in contact with the first pad metal layer 35*a* through the first openings 37*a* of the upper insulation layer 37, and the second bump pad 39*b* is in contact with the second pad metal layer 35*b* through the second openings 37*b* of the upper insulating layer 37. The second bump pad 39*b* may also cover upper regions of the second openings 33*b* of the lower insulation layer 33.

In the present embodiment, the second openings 33*b* of the lower insulation layer 33 and the second openings 37*b* of the upper insulation layer 37 may be disposed in various ways. In this embodiment, these second openings 33*b* and 37*b* are disposed in equal numbers on each of the mesas M1, M2 and M3, with the second opening 33*b* and the second opening 37*b* disposed over and under thereof, and have a mirror symmetrical structure overall.

In the present embodiment, near the side surfaces of the mesas M1, M2, and M3 along the edge of the substrate 21, the reflection structure 50 is also disposed on the first conductivity type semiconductor layer 23 exposed through mesa etching. The reflection structure 50 is spaced apart from the side surfaces of the mesas M1, M2, and M3 disposed adjacent to the edge of the substrate 21, and is also spaced apart from a side coating layer(s) 40 covering the side surfaces of the mesas M1, M2, and M3. Referring to FIG. 10, the reflection structure 50 is spaced apart from an end portion of the upper insulation layer 37 covering the side surfaces of the mesas M1, M2, and M3, and the first conductivity type semiconductor layer 23 exposed between the reflection structure 50 and the end portion of the upper insulation layer 37 may include a groove h which is recessed toward the substrate.

Accordingly, in the present embodiment, similar to the embodiment of FIG. 1, light loss that may occur on the side surface of the light emitting diode chip may also be prevented by the reflection structure 50, and thus light extraction efficiency may improve and, in a process of dividing chips, risk of breakage of other components adjacent to the reflection structure 50 may be excluded, thereby maintaining high reliability of the light emitting diode chip.

Figure 11:
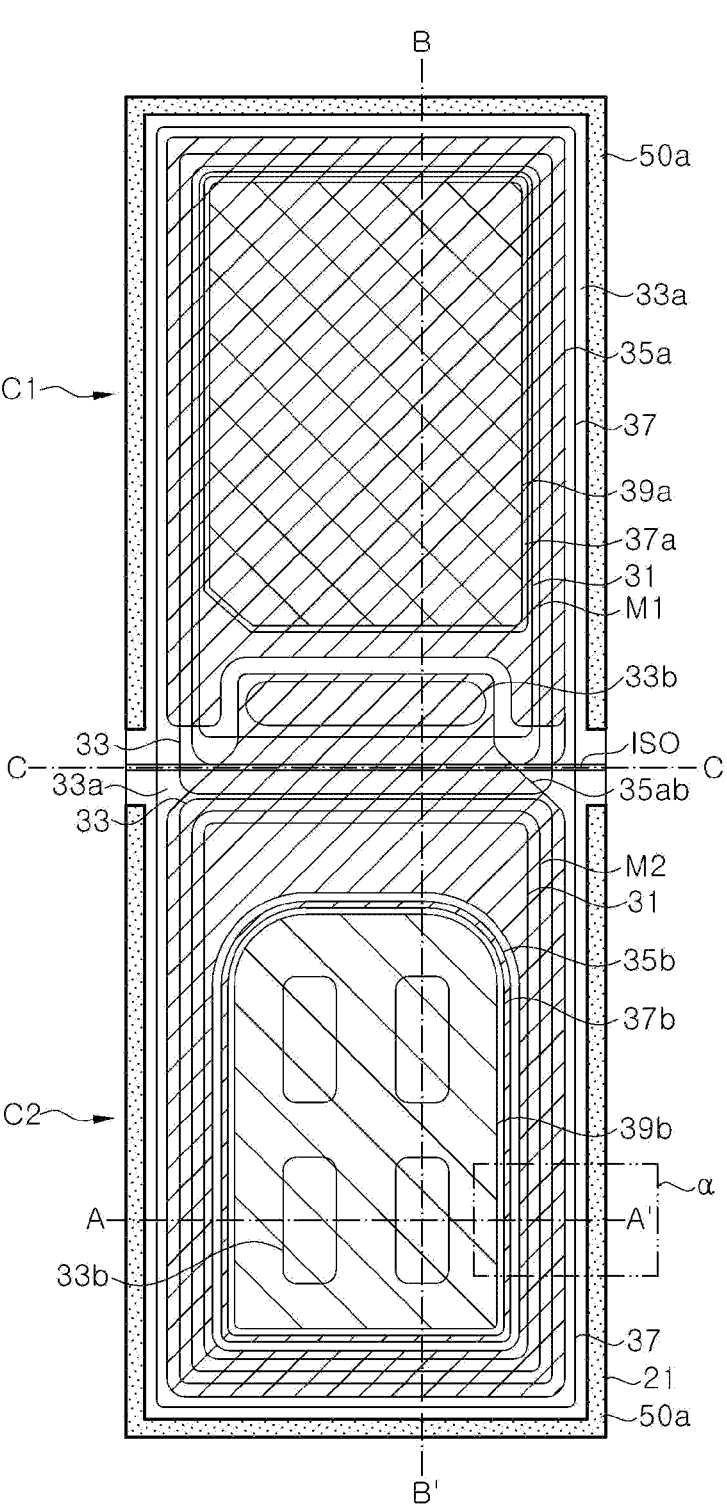
FIG. 11 is a schematic plan view illustrating a light emitting diode chip according to another embodiment of the present disclosure.

FIG. 11 is a schematic plan view illustrating a light emitting diode chip according to another embodiment of the present disclosure.

Referring to FIG. 11, the light emitting diode chip according to the present embodiment is generally similar to that described with reference to FIG. 1, but reflection structures 50*a* are disposed corresponding to the mesas M1 and M2 in the present embodiment although a single reflection structure 50 is shown to have an annular shape surrounding the plurality of mesas M1 and M2 in the embodiment of FIG. 1. That is, the reflection structures 50*a* are spaced apart from one another in a region between the mesas M1 and M2. In particular, the reflection structure 50*a* does not pass across a cell isolation region ISO, and a distance between the reflection structures 50*a* may be greater than a width of the cell isolation region ISO.

In the process of dividing the light emitting diode chips, a portion of the reflection structures 50*a* may have a defect such as lifting, breaking, cracking, or the like. When a single reflection structure 50 is formed as shown in FIG. 1, it may adversely affect all of the light emitting cells C1 and C2 due to the lifting, breaking or cracking on the portion of the reflection structure. In particular, when lifting occurs in the portion of the reflection structure 50, an entire reflection structure 50 may be stripped off under high temperature and high humidity conditions.

On the contrary, since the reflection structures 50*a* are disposed to be spaced apart from one another, even if a defect occurs in one reflection structure 50*a*, remaining reflection structures 50*a* may be safely maintained, and thus reliability of the light emitting diode chip may improve.

In addition, since the reflection structure 50*a* is disposed so as not to pass across the cell isolation region ISO where a step difference is large, the defect may be further prevented from occurring in the reflection structure 50*a*.

Figure 12:
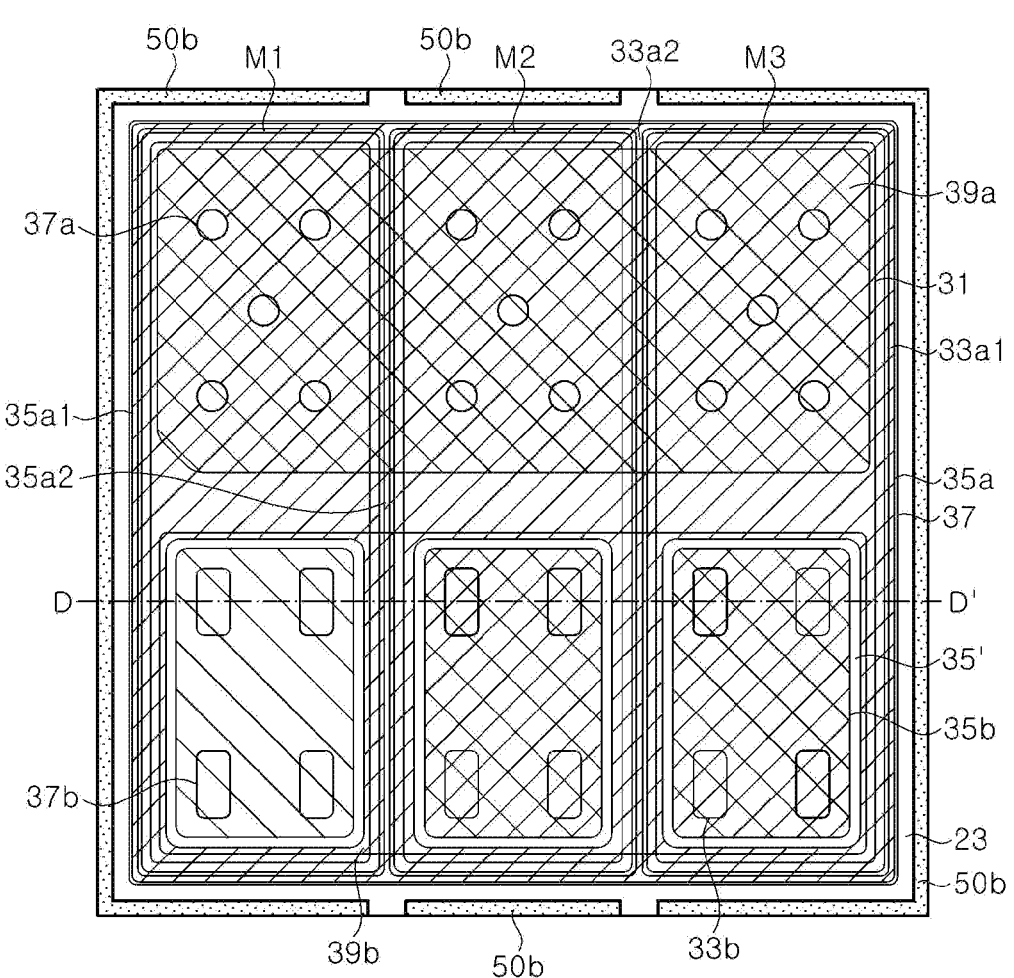
FIG. 12 is a schematic plan view illustrating a light emitting diode chip according to another embodiment of the present disclosure.

FIG. 12 is a schematic plan view illustrating a light emitting diode chip according to another embodiment of the present disclosure. Referring to FIG. 12, the light emitting diode chip according to the present embodiment is generally similar to that described with reference to FIG. 9 except that a plurality of reflection structures 50*b* are disposed to be spaced apart from one another corresponding to mesas M1, M2, and M3.

In the present embodiment, although the light emitting cells are not separated from each other by a cell isolation region ISO, the reflection structures 50*b* are disposed corresponding to the mesas M1, M2, and M3, and thus, it is possible to prevent adverse effects on the entire mesas M1, M2, and M3 by defects generated in some regions of the reflection structures 50*b*. Reliability of the light emitting diode chip may improve.

Figure 13:
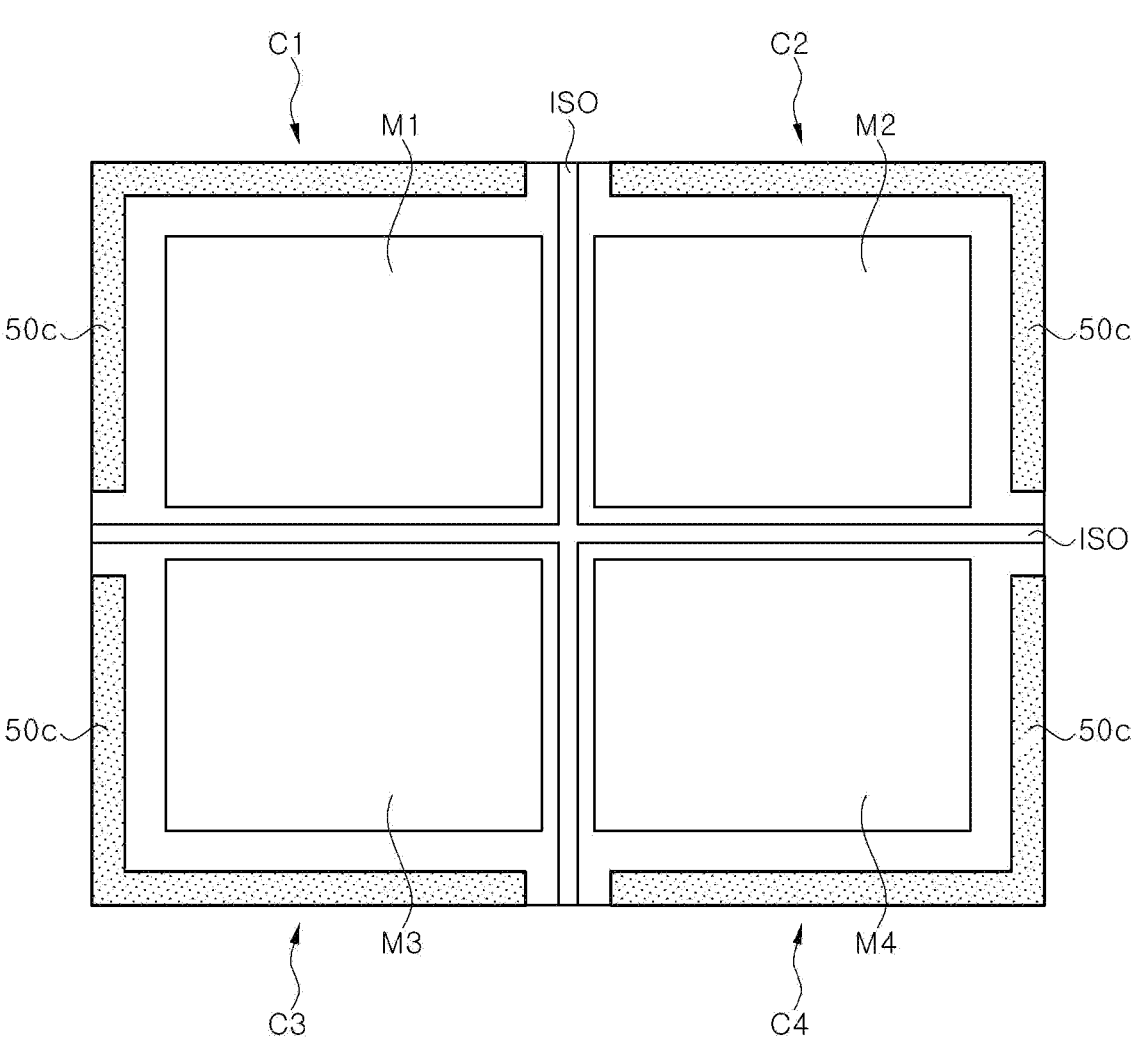
FIG. 13 is a schematic plan view illustrating a light emitting diode chip according to another embodiment of the present disclosure.

FIG. 13 is a schematic plan view illustrating a light emitting diode chip according to another embodiment of the present disclosure. Referring to FIG. 13, the light emitting diode chip according to the present embodiment is generally similar to that described with reference to FIG. 11 except that the light emitting cells C1, C2, C3, and C4 are arranged in form of a matrix. Reflection structures 50*c* are spaced apart from one another corresponding to the mesas M1, M2, M3, and M4. In particular, the reflection structures 50*c* may be spaced apart from one another around a cell isolation region ISO separating the light emitting cells C1, C2, C3, and C4, and may also be spaced apart from the cell isolation region ISO. A distance between the reflection structures 50*c* may be larger than a width of the cell isolation region ISO.

In the present embodiment, a plurality of light emitting cells C1, C2, C3, and C4 are illustrated and described as being separated from one another by the cell isolation region ISO. However, as described with reference to FIG. 12, even in a case that a plurality of mesas M1, M2, and M3, and M4 are formed on a single first conductivity type semiconductor layer 23 without the cell isolation region ISO, a plurality of reflection structures 50c may be disposed to be spaced apart from one another corresponding to the mesas.

Figure 14:
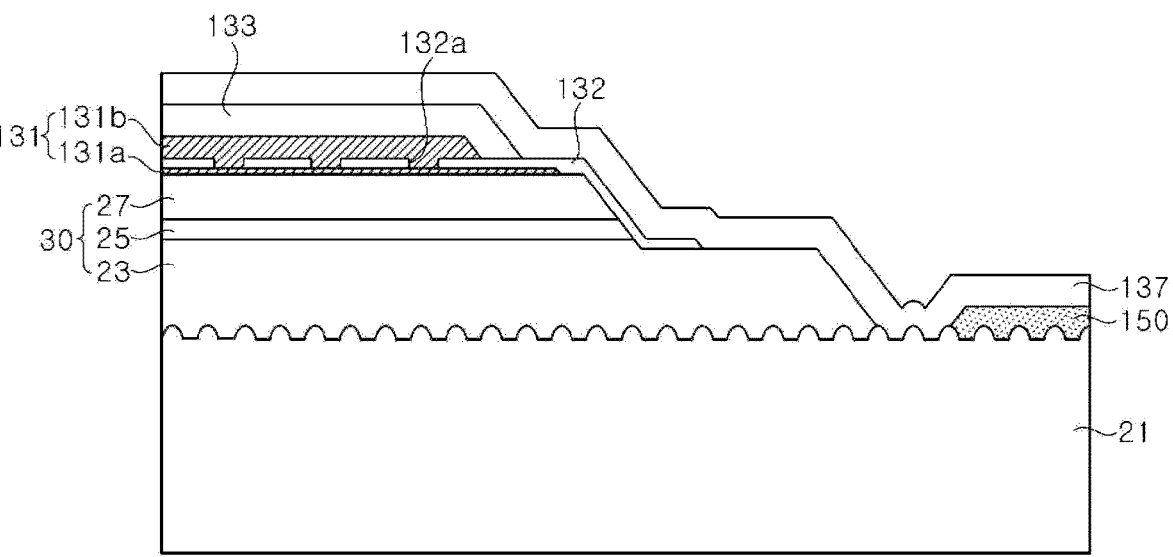
FIG. 14 is a schematic cross-sectional view illustrating a light emitting diode chip according to another embodiment of the present disclosure.

FIG. 14 is a schematic cross-sectional view illustrating a light emitting diode chip according to another embodiment of the present disclosure. Referring to FIG. 14, the light emitting diode chip according to the present embodiment is generally similar to those of the above-described embodiments except that a preliminary insulation layer 29 is omitted, and a current blocking layer 132 is further included, in addition, an ohmic reflection layer 131, a lower insulation layer 133, and an upper insulation layer 137 are modified, and a location of the reflection structure 150 is different. The light emitting diode chip of the present embodiment may also include a first pad metal layer 35a, a second pad metal layer 35b, a connector 35ab, a first bump pad 39a and a second bump pad 39b, and, since these are similar to those in the embodiments described above, detailed descriptions thereof are omitted.

First, the ohmic reflection layer 131 includes a transparent ohmic layer 131a and a metal reflection layer 131b. The transparent ohmic layer 131a is in ohmic contact with a second conductivity type semiconductor layer 27. The transparent ohmic layer 131a may transmit light generated in an active layer 25 and may be formed of, for example, a conductive oxide layer such as ITO or ZnO or a transparent metal layer. Meanwhile, the metal reflection layer 131b may include a metal material which reflects light generated in the active layer 25, for example, Ag or Al.

The current blocking layer 132 is disposed between the transparent ohmic layer 131a and the metal reflection layer 131b, and has openings 132a exposing the transparent ohmic layer 131a. The metal reflection layer 131b connects to the transparent ohmic layer 131a through the openings 132a. The current blocking layer 132 may be formed of a single layer or multiple layers of silicon oxide or silicon nitride.

As illustrated, the current blocking layer 132 may extend from an upper surface of the second conductivity type semiconductor layer 27 to cover a side surface of the mesa, and may cover a portion of an upper surface of the first conductivity type semiconductor layer 23.

The current blocking layer 132 may assist current spreading by preventing an entire surface of the metal reflection layer 131b from connecting to the transparent ohmic layer 131a. In addition, the current blocking layer 132 covers side surfaces of the second conductivity type semiconductor layer 27 and the active layer 25, and thus an electrical short circuit may be prevented from being generated by the metal reflection layer 131b.

Meanwhile, the current blocking layer 132 is spaced apart from the reflection structure 150. Accordingly, it is possible to prevent damage to the current blocking layer 132 while dividing the substrate 21, and, accordingly, reliability of the light emitting diode chip may improve.

Meanwhile, in the above embodiments, although the reflection structure 50 has been described as being disposed on the first conductivity type semiconductor layer 23, in the present embodiment, the reflection structure 150 is disposed on the substrate 21. That is, the reflection structure 150 may be formed on an exposed surface of the substrate 21 by removing the first conductivity type semiconductor layer 23. The reflection structure 150 may be continuously disposed along an edge of the substrate 21. However, the present embodiment is not limited thereto, and, as described with reference to FIGS. 11 through 13, a plurality of reflection structures 150 which are spaced apart may be disposed along the edge of the substrate 21.

The lower insulation layer 133 is spaced apart from the reflection structure 150, and, furthermore, an edge of the lower insulation layer 133 may be disposed on the current blocking layer 132 as shown in the drawing. That is, in the present embodiment, the lower insulation layer 133 may be limitedly disposed on the mesa without covering the side surface of the mesa.

Meanwhile, an upper insulation layers 137 is similar to the upper insulation layers 37 of the above-described embodiments except that the upper insulation layers 137 continuously extends to cover the reflection structure 150 in the present embodiment. The upper insulation layer 137 may be formed of a single layer, or alternatively, multiple layers of silicon oxide or silicon nitride. The upper insulation layer 137 may continuously extend from a region on the mesa to cover the reflection structure 150, and may cover the substrate 21 exposed in a region between the first conductivity type semiconductor layer 23 and the reflection structure 150. However, the present embodiment is not limited thereto, and the upper insulation layer 137 may be spaced apart from the reflection structure 150 as those in the above-described embodiments.

Figure 15:
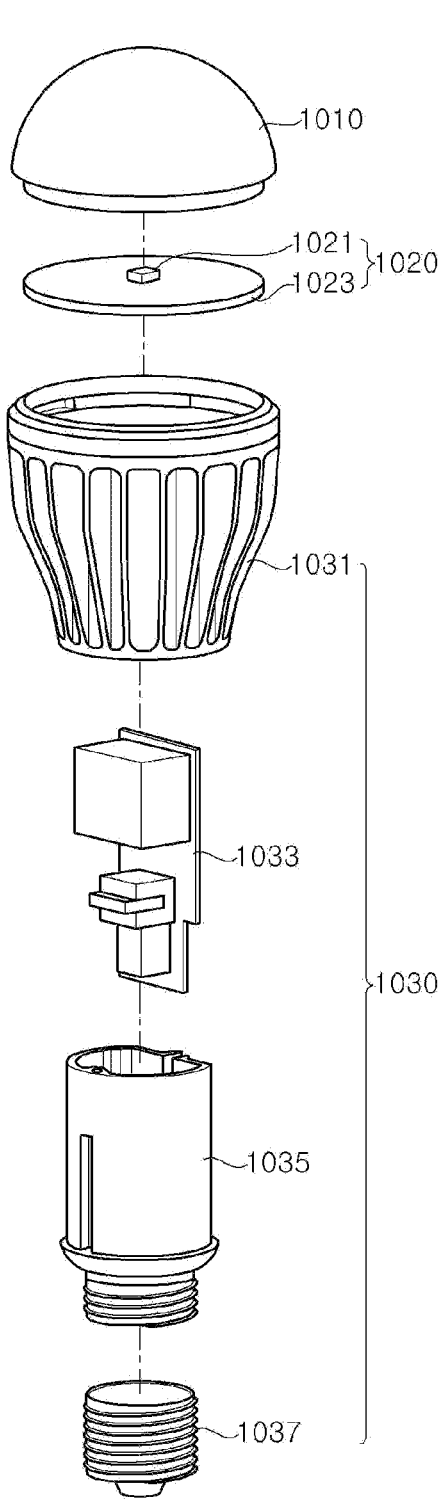
FIG. 15 is an exploded perspective view illustrating a lighting apparatus to which a light emitting diode according to one embodiment of the present disclosure is applied.

FIG. 15 is an exploded perspective view illustrating a lighting apparatus to which a light emitting diode according to one embodiment of the present disclosure is applied.

Referring to FIG. 15, the lighting apparatus according to this embodiment includes a diffusive cover 1010, a light emitting diode module 1020, and a body 1030. The body 1030 may receive the light emitting diode module 1020 and the diffusive cover 1010 may be disposed on the body 1030 to cover an upper region of the light emitting diode module 1020.

The body 1030 may have any shape capable of supplying electric power to the light emitting diode module 1020 while receiving and supporting the light emitting diode module 1020. For example, as shown in the drawing, the body 1030 may include a body case 1031, a power supply 1033, a power supply case 1035, and a power source connection section 1037.

The power supply 1033 is received in the power supply case 1035 to be electrically connected to the light emitting diode module 1020, and may include at least one IC chip. The IC chip may regulate, change or control electric power supplied to the light emitting diode module 1020. The power supply case 1035 may receive and support the power supply 1033, and the power supply case 1035 having the power supply 1033 secured therein may be disposed within the body case 1031. The power source connection section 1037 may be disposed on a lower end of the power supply case 1035 and coupled thereto. Accordingly, the power source connection section 1037 may be electrically connected to the power supply 1033 in the power supply case 1035, and may serve as a passage through which external power may be supplied to the power supply unit 1033.

The light emitting diode module 1020 includes a substrate 1023 and a light emitting diode 1021 disposed on the substrate 1023. The light emitting diode module 1020 may be disposed on an upper region of the body case 1031 and electrically connected to the power supply 1033.

A substrate capable of supporting the light emitting diode 1021 may be used as the substrate 1023 without limitation. For example, the substrate 1023 may include a printed circuit board having interconnections formed thereon. The substrate 1023 may have a shape corresponding to a fixing portion in the upper region of the body case 1031 so as to be stably fixed to the body case 1031. The light emitting diode 1021 may include at least one of the light emitting diodes according to the embodiments described above.

The diffusive cover 1010 is disposed on the light emitting diode 1021, and may be secured to the body case 1031 to cover the light emitting diode 1021. The diffusive cover 1010 may be formed of a light-transmitting material, and light orientation of the lighting apparatus may be adjusted through regulation of the shape and optical transmissivity of the diffusive cover 1010. As such, the diffusive cover 1010 may be modified in various shapes depending on usage and applications of the lighting apparatus.

Figure 16:
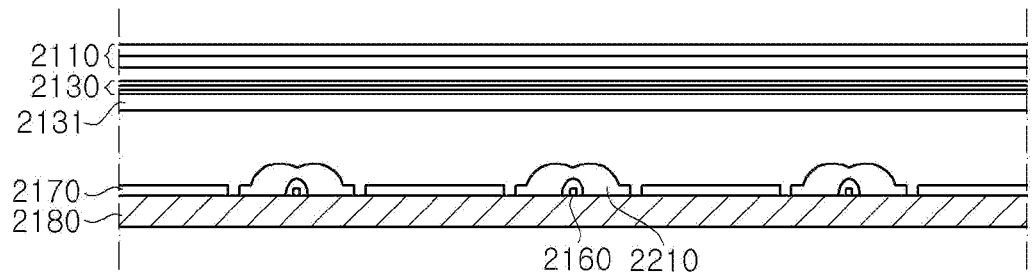
FIG. 16 is a cross-sectional view illustrating a display apparatus to which a light emitting diode according to another embodiment of the present disclosure is applied.

FIG. 16 is a cross-sectional view illustrating a display apparatus to which a light emitting diode according to another embodiment of the present disclosure is applied.

The display apparatus according to the present embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed on the edge of the display panel 2110 to supply driving signals to a gate line. Here, the gate driving PCBs may be formed on a thin layer transistor substrate instead of being formed on separate PCBs.

The backlight unit includes a light source module including at least one substrate and a plurality of light emitting diodes 2160. The backlight unit may further include a bottom cover 2180, a reflection sheet 2170, a diffusive plate 2131, and optical sheets 2130.

The bottom cover 2180 may be open at an upper region thereof to receive the substrate, the light emitting diodes 2160, the reflection sheet 2170, the diffusive plate 2131, and the optical sheets 2130. In addition, the bottom cover 2180 may be coupled to the panel guide. The substrate may be disposed under the reflection sheet 2170 and surrounded by the reflection sheet 2170. Alternatively, in a case that a reflective material is coated onto a surface thereof, the substrate may be disposed on the reflection sheet 2170. Further, a plurality of substrates may be arranged to be flush with each other. However, the present disclosure is not limited thereto, and the light source module may include a single substrate.

The light emitting diodes 2160 may include the light emitting diodes according to the embodiments described above. The light emitting diodes 2160 may be regularly arranged in a predetermined pattern on the substrate. In addition, a lens 2210 may be disposed on each of the light emitting diodes 2160 to improve uniformity of light emitted from the plurality of light emitting diodes 2160.

The diffusive plate 2131 and the optical sheets 2130 are disposed on the light emitting diodes 2160. Light emitted from the light emitting diodes 2160 may be supplied in a form of sheet light to the display panel 2110 through the diffusive plate 2131 and the optical sheets 2130.

In this way, the light emitting diodes according to the embodiments may be applied to direct type display apparatuses such as the display apparatus according to the present embodiment.

Figure 17:
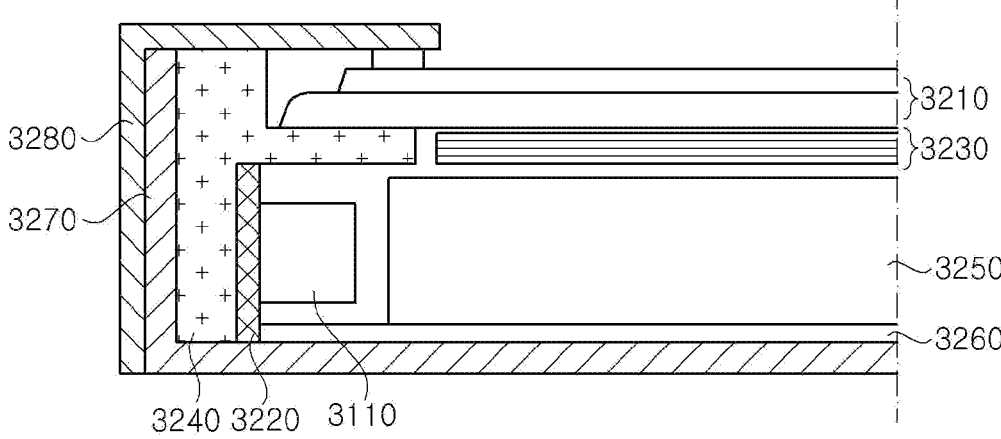
FIG. 17 is a cross-sectional view illustrating a display apparatus to which a light emitting diode according to another embodiment of the present disclosure is applied.

FIG. 17 is a cross-sectional view illustrating a display apparatus to which a light emitting diode according to another embodiment of the present disclosure is applied. The display apparatus according to the present embodiment includes a display panel 3210 on which an image is displayed, and a backlight unit disposed on a rear side of the display panel 3210 and emitting light thereto. Further, the display includes a frame 240 supporting the display panel 3210 and receiving the backlight unit, and covers 3240 and 3280 surrounding the display panel 3210.

The display panel 3210 is not particularly limited and may be, for example, a liquid crystal panel including a liquid crystal layer. A gate driving PCB may be further disposed on an edge of the display panel 3210 to supply driving signals to a gate line. Here, the gate driving PCB may be formed on a thin layer transistor substrate instead of being formed on a separate PCB. The display panel 3210 may be secured by the covers 3240 and 3280 disposed on upper and lower regions thereof, and the cover 3280 disposed under the display panel 3210 may be coupled to the backlight unit.

The backlight unit supplying light to the display panel 3210 includes a lower cover 3270 partially open on an upper region thereof, a light source module disposed on one side inside the lower cover 3270, and a light guide plate 3250 disposed being flush with the light source module and converting spot light into sheet light. In addition, the backlight unit according to the present embodiment may further include optical sheets 3230 disposed on the light guide plate 3250 to spread and collect light, and a reflection sheet 3260 disposed under the light guide plate 3250 and reflecting light traveling in a downward direction of the light guide plate 3250 towards the display panel 3210.

The light source module includes a substrate 3220 and a plurality of light emitting diodes 3110 disposed at constant intervals on one surface of the substrate 3220. As the substrate 3220, any substrate capable of supporting the light emitting diodes 3110 and being electrically connected thereto may be used without limitation. For example, the substrate 3220 may include a printed circuit board. The light emitting diodes 3110 may include at least one of the light emitting diodes according to the embodiments described above. Light emitted from the light source module incidents on the light guide plate 3250 and is supplied to the display panel 3210 through the optical sheets 3230. Spot light emitted from the light emitting diodes 3110 may be converted into sheet light by the light guide plate 3250 and the optical sheets 3230.

In this way, the light emitting diodes according to the embodiments may be applied to edge type display apparatuses such as the display apparatus according to the present embodiment.

Figure 18:
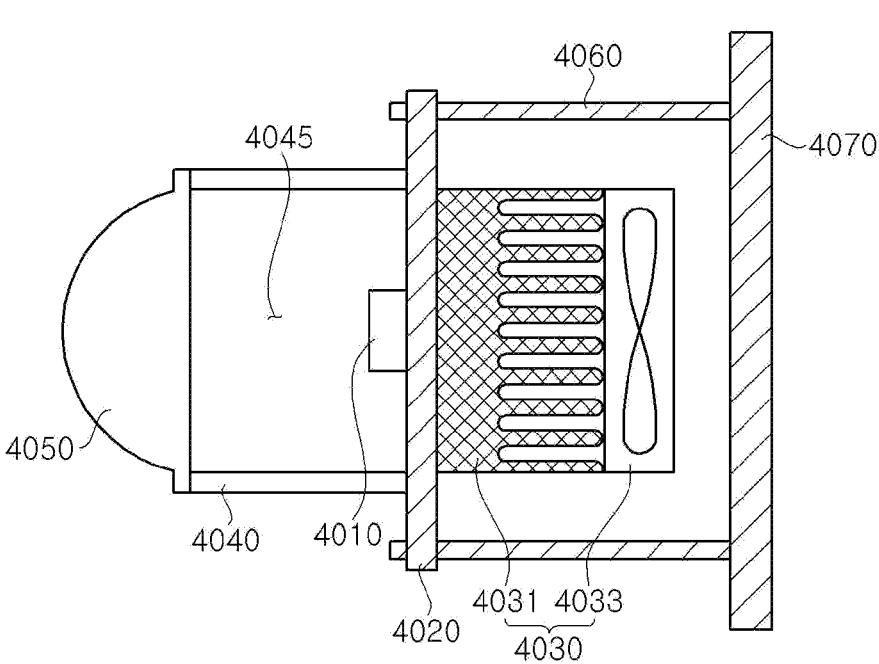
FIG. 18 is a cross-sectional view illustrating a headlight to which a light emitting diode according to another embodiment of the present disclosure is applied.

FIG. 18 is a cross-sectional view illustrating a headlight to which a light emitting diode according to another embodiment of the present disclosure is applied.

Referring to FIG. 18, the headlight includes a lamp body 4070, a substrate 4020, a light emitting diode 4010, and a cover lens 4050. Moreover, the headlight may further include a heat dissipation unit 4030, a support rack 4060, and a connection member 4040.

The support rack 4060 secures the substrate 4020 which is disposed apart on the lamp body 4070. As the substrate 4020, a member capable of supporting the light emitting diode 4010 may be used without limitation. For example, the substrate 4020 may include a substrate having a conductive pattern, such as a printed circuit board. The light emitting diode 4010 may be disposed on the substrate 4020 and supported and secured by the substrate 4020. In addition, the light emitting diode 4010 may be electrically connected to an external power source through the conductive pattern of the substrate 4020. Further, the light emitting diode 4010 may include at least one of the light emitting diodes according to the embodiments described above.

The cover lens 4050 is disposed on a path of light emitted from the light emitting diode 4010. For example, as shown in the drawing, the cover lens 4050 may be spaced apart from the light emitting diode 4010 by the connection member 4040 and disposed in a direction of supplying light emitted from the light emitting diode 4010. An orientation angle and/or a color of light emitted by the headlight may be adjusted by the cover lens 4050. Meanwhile, the connection member 4040 may serve as a light guide that provides a luminous path 4045 while securing the cover lens 4050 to the substrate 4020 and disposed to surround the light emitting diode 4010. In this case, the connection member 4040 may be formed of a light reflective material or coated therewith. Meanwhile, the heat dissipation unit 4030 may include heat dissipation fins 4031 and/or a heat dissipation fan 4033, and dissipates heat generated upon operation of the light emitting diode 4010 to the outside.

As such, the light emitting device according to the embodiments of the present disclosure may be applied to the headlight, in particular, a vehicular headlight as that in the present embodiment.

Although some embodiments have been described herein, it should be understood that these embodiments are provided for illustration only and are not to be construed in any way as limiting the present disclosure. It should be understood that features or components of one embodiment can also be applied to other embodiments without departing from the spirit and scope of the present disclosure.

The invention claimed is:

1. A light emitting device comprising:
   a first conductivity type semiconductor layer including a first surface and a second surface that is opposite to the first surface;
   a second conductivity type semiconductor layer;
   an active layer disposed between the first conductivity type semiconductor layer and the second conductivity type semiconductor layer; and
   a side coating layer covering side surfaces of the active layer and the second conductivity type semiconductor layer,
   wherein the active layer and the second conductivity type semiconductor layer are disposed on a partial region of the first conductivity type semiconductor layer to expose at least a portion of the first surface of the first conductivity type semiconductor layer,
   wherein the at least the portion of the first surface of the first conductivity type semiconductor layer has a region having a first horizontal elevation and a region having a second horizontal elevation lower than the first horizontal elevation, and
   wherein the first conductivity type semiconductor layer has a roughened region on a portion of the second surface that is opposite to the region having the first horizontal elevation.

2. The light emitting device of claim 1, wherein a distance between the region having the second horizontal elevation and the roughened region is smaller than a distance between the region having the first horizontal elevation and the roughened region.

3. The light emitting device of claim 1, further comprising a reflection structure spaced apart from the side coating layer and disposed on the at least the portion of the first surface of the first conductivity type semiconductor layer.

4. The light emitting device of claim 3, wherein the region having the second horizontal elevation is disposed between an end portion of the side coating layer and an end portion of the reflection structure.

5. The light emitting device of claim 1, wherein the side coating layer extends from the side surfaces of the active layer and the second conductivity type semiconductor layer to cover the at least the portion of the first surface of the first conductivity type semiconductor layer.

6. The light emitting device of claim 1, wherein the side coating layer includes insulation material.

7. The light emitting device of claim 6, further comprising: a first metal layer electrically connected to the first conductivity type semiconductor layer and covering the insulation material.

8. A light emitting device comprising:
   a first conductivity type semiconductor layer including a first surface and a second surface that is opposite to the first surface;
   a second conductivity type semiconductor layer;
   an active layer disposed between the first conductivity type semiconductor layer and the second conductivity type semiconductor layer; and
   a side coating layer covering a side surface of the active layer and the second conductivity type semiconductor layer,
   wherein the active layer and the second conductivity type semiconductor layer are disposed on a partial region of the first conductivity type semiconductor layer to expose at least a portion of the first surface of the first conductivity type semiconductor layer,
   wherein the at least the portion of the first surface of the first conductivity type semiconductor layer has a region having a first horizontal elevation and a region having a second horizontal elevation lower than the first horizontal elevation, and
   wherein the first conductivity type semiconductor layer has a roughened region on a portion of the second surface that is opposite to the region having the second horizontal elevation.

9. The light emitting device of claim 8, wherein a distance between the region having the second horizontal elevation and the roughened region is smaller than a distance between the region having the first horizontal elevation and the roughened region.

10. The light emitting device of claim 8, further comprising a reflection structure spaced apart from the side coating layer and disposed on the at least the portion of the first surface of the first conductivity type semiconductor layer.

11. The light emitting device of claim 10, wherein the region having the second horizontal elevation is disposed between an end portion of the side coating layer and an end portion of the reflection structure.

12. The light emitting device of claim 8, wherein the side coating layer extends from side surfaces of the active layer and the second conductivity type semiconductor layer to cover the at least the portion of the first surface of the first conductivity type semiconductor layer.

13. The light emitting device of claim 8, wherein the side coating layer includes insulation material.

14. The light emitting device of claim 13, further comprising: a first metal layer electrically connected to the first conductivity type semiconductor layer and covering the insulation material.

\* \* \* \* \*